United States Patent
Rabiei

(10) Patent No.: US 9,229,158 B2
(45) Date of Patent: Jan. 5, 2016

(54) METHOD FOR PRODUCTION OF OPTICAL WAVEGUIDES AND COUPLING AND DEVICES MADE FROM THE SAME

(71) Applicant: Payam Rabiei, Orlando, FL (US)

(72) Inventor: Payam Rabiei, Orlando, FL (US)

( * ) Notice: Subject to any disclaimer, the term of this patent is extended or adjusted under 35 U.S.C. 154(b) by 0 days.

(21) Appl. No.: 14/682,803

(22) Filed: Apr. 9, 2015

(65) Prior Publication Data

US 2015/0323737 A1 Nov. 12, 2015

Related U.S. Application Data

(63) Continuation of application No. 14/273,002, filed on May 8, 2014, now Pat. No. 9,111,730.

(51) Int. Cl.
| | |
|---|---|
| *G02B 6/122* | (2006.01) |
| *G02B 6/10* | (2006.01) |
| *G02B 6/02* | (2006.01) |
| *G02B 6/036* | (2006.01) |
| *C23C 14/34* | (2006.01) |

(52) U.S. Cl.
CPC ............ *G02B 6/02295* (2013.01); *C23C 14/34* (2013.01); *G02B 6/03677* (2013.01); *G02B 2207/101* (2013.01)

(58) Field of Classification Search
CPC . H01L 33/025; H01L 33/10; H01L 21/31116; H01L 2924/0002; G02B 6/1223; G02B 6/1228; G02B 6/1221; G02B 6/13; G02B 6/12009; G02B 6/10; G02B 6/107; G02B 6/12033; G02B 6/122; G02B 6/29364; G02F 1/035; G02F 1/395; G02F 1/225; G01J 5/0818; B29D 11/00663
See application file for complete search history.

(56) References Cited

U.S. PATENT DOCUMENTS

| | | | |
|---|---|---|---|
| 4,640,592 A * | 2/1987 | Nishimura et al. | 385/125 |
| 6,775,453 B1 * | 8/2004 | Hornbeck et al. | 385/129 |
| 7,106,448 B1 * | 9/2006 | Vawter et al. | 356/461 |
| 7,116,852 B2 * | 10/2006 | Tuda | 385/14 |
| 2007/0237442 A1 * | 10/2007 | Marks et al. | 385/2 |
| 2008/0165565 A1 * | 7/2008 | Gunter et al. | 365/145 |
| 2008/0212914 A1 * | 9/2008 | Marks et al. | 385/2 |

* cited by examiner

*Primary Examiner* — Thomas L Dickey
*Assistant Examiner* — Gustavo Ramallo
(74) *Attorney, Agent, or Firm* — Invent Capture, LLC.; Samuel S. Cho

(57) ABSTRACT

Novel processing methods for production of high-refractive index contrast and low loss optical waveguides are disclosed. In one embodiment, a novel waveguide is produced by first depositing or growing a first low refractive index material layer as a cladding layer on top of a base substrate. Then, a first high refractive index material layer is deposited or transferred to the top of the cladding layer to form a slab core region. Subsequently, a second high refractive index material layer is deposited on top of the slab core region, and an etch mask layer is formed. Furthermore, the second high refractive index material layer is selectively etched by utilizing a dry-etching tool with high selectivity to the etch mask layer, and a second low refractive index material layer is deposited as a top cladding layer to encapsulate the second high refractive index material layer on top of lower cladding layers.

7 Claims, 14 Drawing Sheets

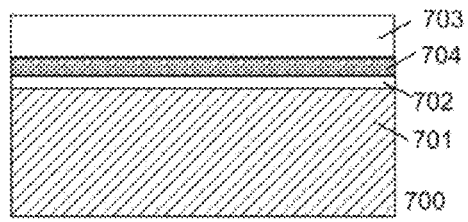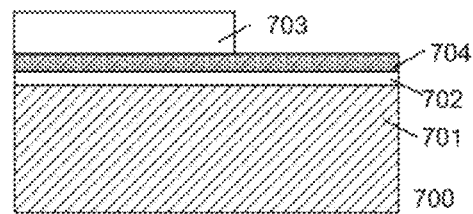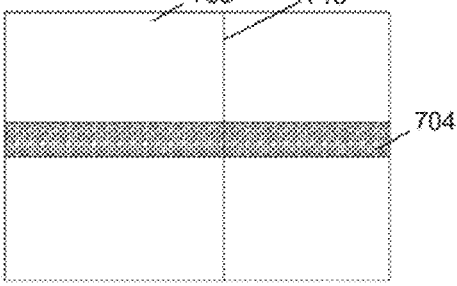
FIG. 7a   FIG. 7b
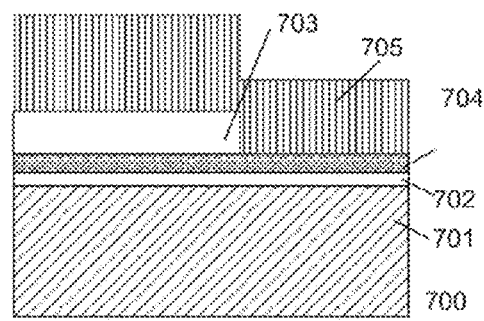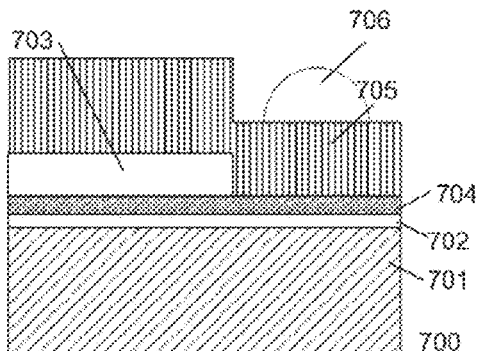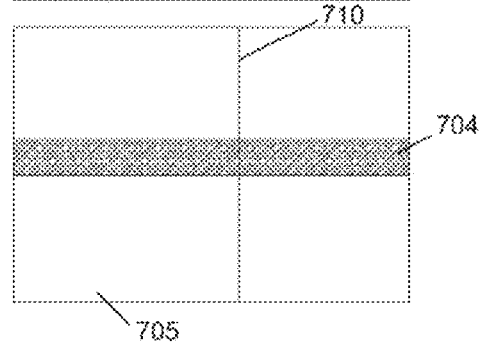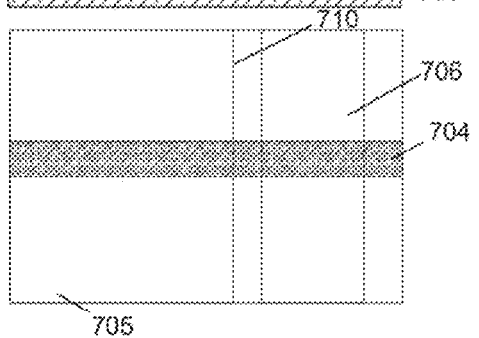
FIG. 7c   FIG. 7d

METHOD FOR PRODUCTION OF OPTICAL WAVEGUIDES AND COUPLING AND DEVICES MADE FROM THE SAME

FIELD OF THE INVENTION

The present invention generally relates to a method for production of highly-confined optical nano-waveguides and a method for coupling optical energy from an optical fiber to the highly-confined optical nano-waveguide. Furthermore, the present invention also relates to a method for creating high-confinement optical nano-waveguides in optical materials such as lithium niobate, lithium tantalate, tantalum oxide, niobium oxide, titanium oxide, lanthanum oxide, or another metal oxide. In addition, the present invention also relates to a method for fabricating optical waveguides that can simultaneously achieve high confinement, low loss, high precision, and narrow nano-gap between adjacent waveguides for coupled waveguide devices. The present invention also relates to a novel device and fabrication method for coupling optical energy from an optical fiber to an optical nano-waveguide.

BACKGROUND OF THE INVENTION

In numerous electronic communication applications, optical waveguides are used in various optical circuits. A typical optical waveguide may comprise a core layer and a cladding layer. Generally, the core layer of an optical waveguide has a higher refractive index, while the cladding layer has a lower refractive index. The optical energy is transported in the core layer by total internal reflection at the boundary of core and cladding layer. By adjusting the index difference between the core layer and the cladding layer, a high-confinement or low-confinement optical waveguide can be produced.

A high-confinement optical waveguide typically has an effective refractive index difference of more than 0.1 between the core layer and the cladding layer. In a low-confinement optical waveguide, the difference in effective refractive index is less than 0.1. A low-confinement waveguide may typically have dimensions in the range of 5 microns in its width, length, and/or height. In contrast, a high-confinement optical nano-waveguide may have typical dimensions smaller than 1 micron in its width and/or height.

Furthermore, a low-confinement optical waveguide is typically curved into a radius typically larger than 0.5 mm, because a radius smaller than approximately 0.5 mm may cause the optical energy to leak or radiate out. In contrast, a high-confinement optical nano-waveguide can be curved into a radius smaller than 0.5 mm and can be bent to a radius as small as 1 micron. Compact and efficient optical circuits, which are difficult to manufacture using low-confinement optical waveguides, can be made using highly-confined optical nano-waveguides. An optical circuit typically includes a plurality of optical waveguides which are connected or coupled together.

Several methods have been used for production of optical waveguides in the past. These conventional methods can be divided into three groups. In the first group of conventional methods for producing optical waveguides, an optical waveguides core is created in a thin film of optically transparent material by a lithographic process and an etching method. The lithographic process defines the geometry of the optical waveguide in a resist and the etching method transfer the lithographically defined optical waveguide into the thin film substrate. Various optically transparent thin films such as silicon dioxide, polymers, silicon, InP, and GaAs have been patterned to create an optical waveguide using this method. A cladding layer is deposited on the etched core layer using various deposition methods. Bayram Unal, et. al. in Appl. Phys. Lett. (86, 021110, (2005)) publication discuses a waveguide made of tantalum pentoxide, wherein the waveguide is produced by lithography and etching method to accommodate lasers. Furthermore, in another publication, D H Hensler et. al in Applied Optics (Vol 10, No 5, pp 1037, (1971)) publication discusses waveguides of tantalum pentoxide that are produced by an etching step.

In the second group of conventional methods for producing optical waveguides, a metal layer diffusion, such as titanium or proton exchange diffusion methods, has been used for defining an optical waveguide in ferroelectric crystals of lithium niobate, lithium tantalite, and silicon dioxide (i.e. glass). In titanium diffusion, a thin layer of titanium is deposited on the surface of the crystal, patterned using lithographic methods, and diffused into the crystal by heating the crystal to very high temperatures. RV Schmidt and IP Kaminov in Appl. Phys. Lett. (Vol. 25, pp 458, (1974)) publication demonstrated these waveguides on the surface of LiNbO3. The diffused metal layer raises the refractive index of the crystal and hence create a core layer. The cladding layer is the original crystal. In a proton exchange method the crystal is immersed in acidic solution and the lithium is replaced with hydrogen in a high temperature bath, which raises the refractive index of the crystal and creates the core of the waveguide. M. De Mitcheli, et. al. in Optics Letters (Vol 8, No 2, pp 114, (1983)) publication demonstrated waveguides based on this technique in lithium niobate. This method has been widely used for production of low-loss and low-confinement optical waveguides.

The third group of conventional methods for producing optical waveguides has been disclosed in the past for production of highly-confined waveguides in silicon. For example, K K Lee et al. in Optics Letters (Vol 26, No 23, pp 1888-1890, (2001)) publication demonstrated this method of fabrication for creating low-loss waveguides. In this method, an optical waveguide pattern is defined by optical lithographic methods and is transferred to an intermediate layer of silicon nitride. Instead of etching the silicon waveguide layer, an oxidation method in a high temperature furnace is used to selectively convert the silicon material into silicon dioxide. The silicon dioxide has low refractive index and can form the cladding region of the optical waveguide. The core layer of the waveguides can be formed by the original non-oxidized silicon layer using this method.

The metal diffusion based methods and the proton exchange methods provide low scattering loss waveguides in ferroelectric materials. However, these conventional methods create low-confinement optical waveguides, resulting in large optical waveguides which are not suitable for many novel optical circuits. Furthermore, the low-confinement waveguides are associated with large modulation voltage for electro-optical modulators, low efficiencies in nonlinear optical waveguides made from ferroelectric crystals, and low efficiencies in active optical waveguides that are made by doping crystals with dopants, such as erbium-doped optical waveguides.

By utilizing conventional etching methods, highly-confined optical waveguides can be produced. However, because the sidewall roughness scattering losses are very important in highly-confined optical waveguides, conventional etching methods present significant challenges. For example, an optical waveguide produced by using lithography and etching typically suffers from nano-meter scale sidewall roughness, which scatters the light out of the core layer of the highly-confined waveguides. Furthermore, the etching of ferroelectric materials such as lithium niobate and lithium tantalate is very difficult. For example, in many situations, it is not possible to achieve straight sidewalls required for highly-confined waveguides when the etching of certain ferroelectric materials are attempted.

For creating the cladding of an optical waveguide, conventional oxidation methods have been used, especially for silicon-based waveguides. However, silicon is not transparent in most of optical spectrum and has a very high refractive index, which complicates the fabrication of many optical circuits.

Furthermore, for coupling light from an optical fiber to a high-index contrast waveguide, several methods have been disclosed in the past. In one example, US2011/0013869A1 publication discloses a method for coupling lasers or optical fibers to an optical circuit using a plurality of small microlenses that are manipulated by a micro-electromechanical devices in order to achieve necessary alignment tolerances. This method for coupling the light to high-index contrast waveguides requires a plurality of small optical lenses and individual alignment for each lens, which is time consuming and expensive to manufacture.

In another example, US2010/0135615A1 and US7643719B1 publications disclose a coupling mechanism based on a graded-index (GRIN) lens, which is deposited on a substrate's surface and is etched into the substrate to form a GRIN lens in the vertical direction. In this example, a patterned edge is created and forms a curved surface for horizontal focusing in order to couple light from an optical fiber to a high-index contrast waveguide. The GRIN lens method disclosed in these publications requires a precise control of refractive index profile, and it is generally difficult to manufacture an exact refractive index profile with a high level of precision.

Other conventional methods for coupling light from an optical fiber to high-index contrast waveguides include using grating couplers. For example, U.S. Pat. No. 5,033,812 and U.S. Pat. No. 5,101,459 publications disclose a grating device formed on the surface of the device. In this example, the grating device is used to couple the light from an optical fiber or free space to the high-contrast waveguide. The grating coupler is polarization-sensitive and wavelength-sensitive, and it can be used to couple one polarization of light to the waveguide around a specific wavelength. Unfortunately, the fabrication of grating coupler is difficult because of very small feature size manufacturing requirements. In addition, there are light scattering-related losses associated with the grating coupler.

Another type of conventional coupling method is related to tapered waveguides for coupling of optical energy between an optical fiber and a high-index contrast waveguide. For example, U.S. Pat. No. 7,239,779B2 discloses a method to achieve optical coupling via transfer of energy between waveguides on different layers. This method related to tapered waveguides were used for coupling optical energy between an optical fiber and a high-index contrast waveguide.

It may be beneficial to device a novel method to produce a high-confinement and low-loss optical waveguide. In one or more embodiments of the invention, this novel high-confinement and low-loss optical waveguide may be used singularly or in combination with ferroelectric crystals such as lithium niobate and lithium tantalate. Furthermore, the novel method for producing the high-confinement and low-loss optical waveguide may enable or assist production of high-confinement and low-loss optical waveguides in ferroelectric crystals. Moreover, the novel method for producing the high-confinement and low-loss optical waveguide in accordance with one or more embodiments of the invention may resolve at least some problems that exist in manufacturing extremely small and precise gaps required for coupling of optical energy between high-confinement waveguides.

Furthermore, it may also be beneficial to devise a novel method to couple light to a high-confinement optical waveguide. Because the mode size of a nano waveguide is very small compared to the mode size of an optical fiber (i.e. typically less than 1 micron for a nano waveguide, compared to 10 microns for an optical fiber), the coupling efficiency from an optical fiber to a high-index contrast waveguide is very poor. One or more embodiments of the present invention discloses a novel method to couple light to a high-index contrast waveguide with at least some improved coupling efficiency.

In addition, it may also be beneficial to devise a novel method to produce an optical coupler that can be used to couple light from an optical fiber to a high-index contrast optical waveguide with high efficiency. In one or more embodiments of the invention, this coupler may provide significant advantages as a polarization and wavelength-independent device that can also be manufactured easily.

SUMMARY

Summary and Abstract summarize some aspects of the present invention. Simplifications or omissions may have been made to avoid obscuring the purpose of the Summary or the Abstract. These simplifications or omissions are not intended to limit the scope of the present invention.

In one embodiment of the invention, a method for producing a high-refractive index contrast and low loss optical waveguide is disclosed. This method comprises the steps of: depositing or growing a first low refractive index material layer as a cladding layer on top of a silicon base substrate; depositing or transferring a first high refractive index material layer on top of the first low refractive index material layer to form a slab core region; depositing a second high refractive index material layer on top of the slab core region; forming an etch mask layer on the second high refractive index material layer; selectively etching the second high refractive index material layer by utilizing a dry-etching tool with high selectivity to the etch mask layer; and depositing a second low refractive index material layer as a top cladding layer to encapsulate the second high refractive index material layer on top of lower cladding layers.

In another embodiment of the invention, another method for producing a high-refractive index contrast and low loss optical waveguide is disclosed. This method comprises the steps of: depositing a lower cladding material layer with a first low refractive index on a silicon base substrate; depositing or growing a refractory metal layer on top of the lower cladding material layer with the first low refractive index; forming a trench in a top diffusion barrier layer deposited on the refractory metal layer, wherein the trench has an open surface for the refractory metal layer; oxidizing the open surface of the trench to high-temperature ambient oxygen, wherein the open surface subsequently forms an oxidized refractory metal region, and wherein other parts of the refractory metal layer still covered under the top diffusion layer remain unchanged as a non-oxidized refractory metal region; removing the top diffusion barrier layer using one or more chemical etching agents; removing the non-oxidized refractory metal region by using a dry-etching tool with high-etch selectivity to preserve the oxidized refractory metal region; and depositing a top cladding layer made of a second low refractive index material to encapsulate the oxidized refractory metal region on top of the lower cladding material layer.

Furthermore, in another embodiment of the invention, another method for producing a high-refractive index contrast and low loss optical waveguide is disclosed. This method comprises the steps of: depositing a lower cladding material layer with a first low refractive index on a silicon base substrate; depositing or growing a refractory metal layer on top of the lower cladding material layer with the first low refractive index; forming an etch mask layer deposited on the refractory metal layer; selectively etching the refractory metal layer in a dry etching tool with high selectivity to the etch mask layer; oxidizing the refractory metal layer at high-temperature ambient oxygen, wherein the refractory metal layer subsequently forms an oxidized refractory metal region; and depositing a top cladding layer made of a second low refractive index material to encapsulate the oxidized refractory metal region on top of the lower cladding material layer.

Yet in another embodiment of the invention, another method for producing a high-refractive index contrast and low loss optical waveguide is disclosed. This method comprises the steps of: depositing or growing a low refractive index cladding layer on top of a silicon base substrate; depositing or transferring a high refractive index optical material layer on top of the low refractive index cladding layer to form a slab core region; depositing a thin optically-transparent layer on top of the slab core region; depositing or growing a refractory metal layer on top of the optically-transparent layer; forming a trench in a top diffusion barrier layer on the refractory metal layer, wherein the trench has an open surface for the refractory metal layer; oxidizing the open surface by exposing the open surface of the refractory metal layer to high-temperature ambient oxygen, wherein the open surface of the refractory metal layer subsequently forms an oxidized refractory metal region, and wherein other parts of the refractory metal layer still covered under the top diffusion layer remain unchanged as a non-oxidized refractory metal region; removing the top diffusion barrier layer using one or more chemical etching agents; removing the non-oxidized refractory metal region by using a dry-etching tool with high-etch selectivity to preserve the oxidized refractory metal region; and depositing a top cladding layer made of a second low refractive index material to encapsulate the oxidized refractory metal region.

In another embodiment of the invention, another method for producing a high-refractive index contrast and low loss optical waveguide is disclosed. This method comprises the steps of: depositing or growing a low refractive index cladding layer on top of a silicon base substrate; depositing or transferring a high refractive index optical material layer on top of the low refractive index cladding layer to form a slab core region; depositing a thin optically-transparent layer on top of the slab core region; depositing or growing a refractory metal layer on top of the thin optically transparent layer; forming an etch mask layer deposited on the refractory metal layer; selectively etching the refractory metal layer in a dry etching tool with high selectivity to the etch mask layer; oxidizing the refractory metal layer at high-temperature ambient oxygen, wherein the refractory metal layer subsequently forms an oxidized refractory metal region; and depositing a top cladding layer made of a second low refractive index material to encapsulate the oxidized refractory metal region on top of the lower cladding material layer.

BRIEF DESCRIPTION OF DRAWINGS

FIGS. 7a~7f show process steps for fabrication of micro-lens coupling device in accordance with an embodiment of the invention.

DETAILED DESCRIPTION

Figure 1A:
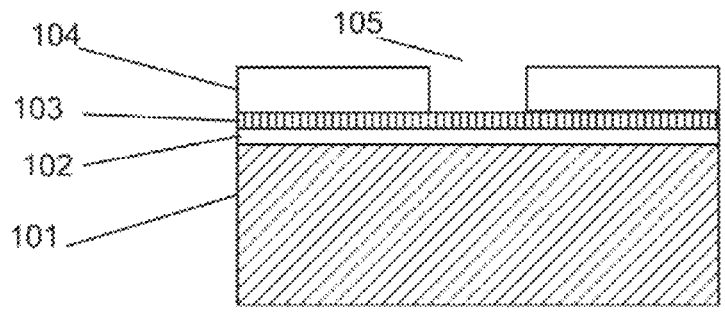
FIGS. 1a~1e show process steps for fabrication of novel channel waveguides with high-refractive index contrast and low loss, wherein the fabrication of the novel channel waveguide utilizes oxidation of refractory metals in accordance with an embodiment of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

The detailed description is presented largely in terms of procedures, logic blocks, processing, and/or other symbolic representations that directly or indirectly resemble a novel high-refractive index contrast waveguide, a method of manufacturing a high-refractive index contrast waveguide, and/or a method of low loss and efficient optical coupling in accordance with various embodiments of the invention. These process descriptions and representations are the means used by those experienced or skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment. Furthermore, separate or alternative embodiments are not necessarily mutually exclusive of other embodiments. Moreover, the order of blocks in process flowcharts or diagrams representing one or more embodiments of the invention do not inherently indicate any particular order nor imply any limitations in the invention.

For the purpose of describing the invention, a term "low refractive index material" is generally defined as having a refractive index less than 1.6. Furthermore, for the purpose of describing the invention, a term "high refractive index material" is generally defined as having a refractive index of 2 or higher.

In one embodiment of the invention, a method to fabricate a highly-confined and low-loss optical nano-waveguide is disclosed. Using this method, the core of an optical nano-waveguide is created by oxidizing a refractory metal such as tantalum or niobium using high temperature in an oxygen-rich ambient. The resulting optical nano-waveguide exhibits low optical loss in a high-confinement structure. Furthermore, a highly-confined and low-loss optical nano-waveguide can also utilize materials such as titanium oxide, lanthanum oxide, another metal oxide, or a high index composite made thereof.

According to this embodiment of the invention, the process for producing a highly-confined optical nano-waveguides is shown in FIGS. 2a~2e, and uses a composite substrate (200), which comprises a thin slab layer of high refractive index material (203) such as tantalum oxide, niobium oxide, ferroelectric crystals (e.g. lithium niobate), or lithium tantalate deposited on a low refractive index cladding layer (202) (e.g. silicon dioxide (SiO2)), wherein the low refractive index cladding layer (202) is deposited or grown on a base substrate (201) (e.g. silicon). The composite substrates (202, 203) is usually prepared by transferring a very thin layer of lithium niobate or lithium tantalate (203) on low refractive index cladding layer (202) using a conventional crystal ion slicing method. In another embodiment of the invention, the thin slab layer of high refractive index material (203) can be produced with deposition of tantalum oxide or niobium oxide by using various deposition methods or by oxidation of a thin metallic layer of tantalum or niobium.

Figure 2A:
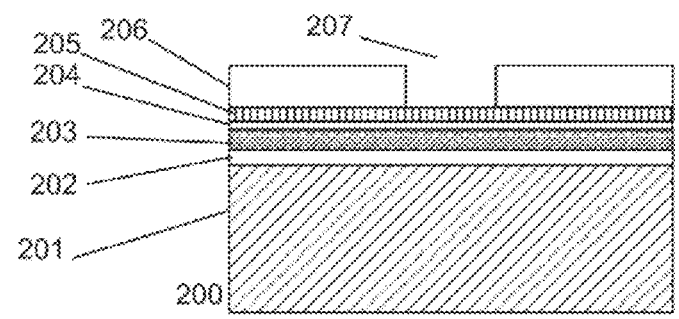
FIGS. 2a~2e show process steps for fabrication of novel ridge waveguides with high-refractive index contrast and low loss, wherein the fabrication of the novel ridge waveguide utilizes oxidation of refractory metals in accordance with an embodiment of the invention.
Figure 2B:
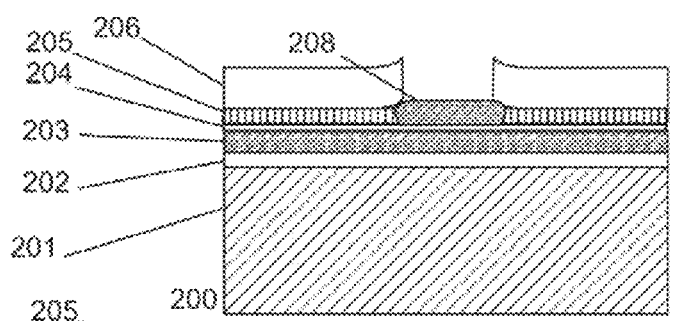
Figure 2C:
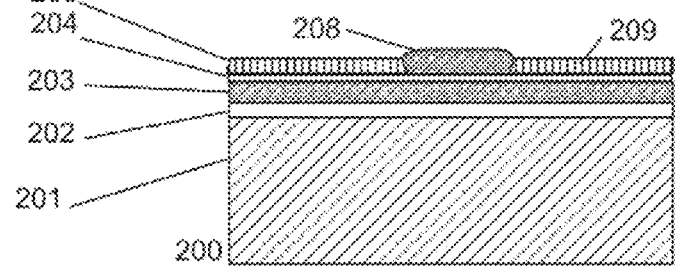
Figure 2D:
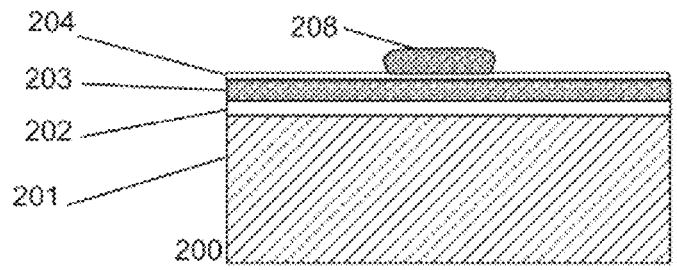

In one embodiment of the invention, the process for producing optical waveguide is characterized by the following process steps:

1) an optional first stage for depositing a thin optically-transparent layer (204) such as silicon dioxide to a lower layer (e.g. 203);

2) a second stage for depositing a thin film refractory metal layer (205) using evaporation or sputtering methods, wherein the thin film refractory metal layer (205) comprising tantalum or niobium;

3) a third stage for depositing a top diffusion barrier layer (206) using chemical vapor deposition (CVD), sputtering, or evaporation of a dielectric or a metal layer such as silicon dioxide, silicon nitride, or other materials, which act as a top diffusion barrier to the refractory metal layer (205) underneath;

4) a fourth stage for opening a via in the top diffusion barrier layer (206) using standard contact lithography or other lithographic methods and etching to form a trench (207) in the top diffusion barrier layer (206);

5) a fifth stage for exposing the composite substrate (200) with the top diffusion barrier layer (206) to high temperature in an oxidizing environment to selectively oxidize a refractory metal layer (208) as shown in FIG. 2b;

6) a sixth stage for removing the top diffusion barrier layer (206) in a selective chemical enchant such as buffered oxide etching in a way that the underlying refractory metal layer (205) and the oxidized refractory metal layer (208) are not removed;

7) a seventh stage for selectively removing the non-oxidized refractory metal layer (209) using a selective etching method such that the oxidized refractory metal layer (208) is enabled to form a ridge waveguide structure, as shown in FIG. 2c and FIG. 2d;

8) an eight stage for full oxidation of the remaining refractory metal residues that might have remained after the seventh stage; and 9) a ninth stage for depositing a low refractive index top cladding layers (210) to encapsulate the optical waveguide.

Figure 11A:
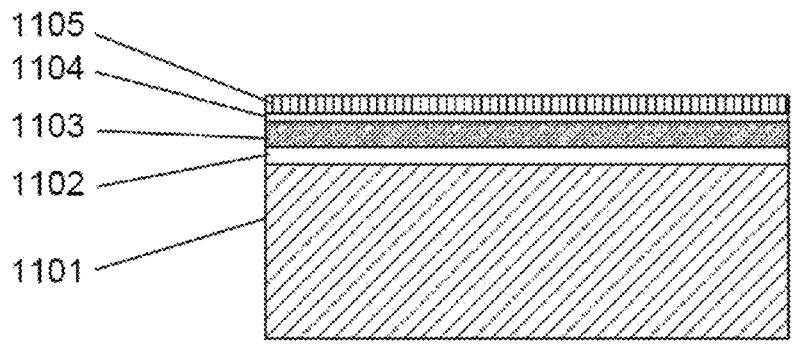
FIGS. 11a~11d show process steps for fabrication of novel ridge waveguides with high-refractive index contrast and low loss, wherein the fabrication of the novel ridge waveguide utilizes oxidation of refractory metals in accordance with an embodiment of the invention.
Figure 11B:
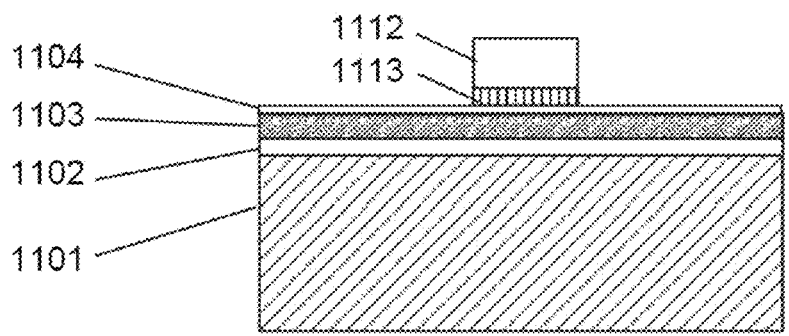
Figure 11C:
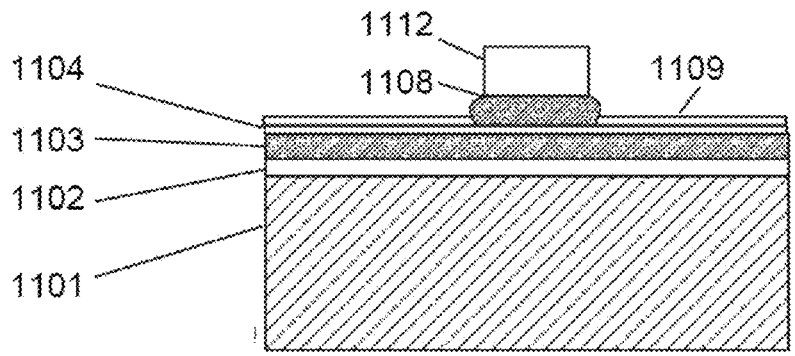
Figure 11D:
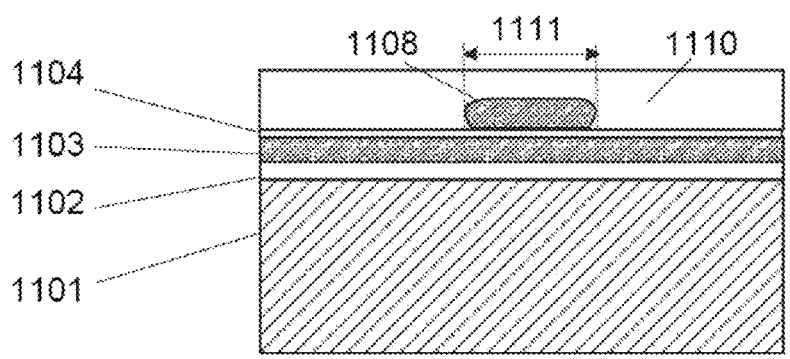

In an alternate embodiment of the invention, the process steps for manufacturing a high refractive index contrast waveguide are shown in FIGS. 11a~d, and compromise the following steps:

1) an optional first stage for depositing a thin optically-transparent layer (1104) such as silicon dioxide to a lower layer (e.g. 1103);

2) a second stage for depositing a thin film refractory metal layer (1105) using evaporation or sputtering methods, wherein the thin film refractory metal layer (1105) comprises tantalum or niobium;

3) a third stage for depositing a top etch mask layer (1112) using chemical vapor deposition (CVD), sputtering, evaporation of a dielectric or a metal layer such as silicon dioxide, silicon nitride, or other materials, or spin-coating a photoresist and lithographically patterning the layer to form an etch mask to the refractory metal layer (1113) underneath;

4) a fourth stage for selectively removing the remaining refractory metal layer (1113) using a highly selective etching method with respect to the etch mask layer (1112), as shown in FIG. 11b;

an optional stage for removing the etch mask layer (1112);

5) a fifth stage for exposing the composite substrate (1101, 1102, 1103, 1104) with or without the top etch mask layer (1112) to high temperature in an oxidizing environment to oxidize the refractory metal layer to form oxidized refractory metal ridge (1108) as shown in FIG. 11c; and 6) a ninth stage for depositing a low refractive index top cladding layer (1110) to encapsulate the optical waveguide, as shown in FIG. 11*d*.

According to this embodiment of the invention, the method for production of optical nano-waveguide eliminates one or more rough sidewalls, which are undesirably produced during the lithography in a conventional manufacturing method. By using diffusion of oxygen atoms during the oxidation process of the refractory material, a smooth boundary is created between the oxidized and non-oxidized regions in the refractory metal layer. Furthermore, the process uses highly selective etching of refractory metal with respect to other dielectric materials or organic materials to minimize or eliminate surface roughness during or after the etching process. Therefore, one or more rough side walls of the waveguide, which may be undesirably created during a conventional lithography step, can be reduced and/or eliminated by using the novel method in accordance with an embodiment of the invention.

Furthermore, in one embodiment of the invention, the final product of manufacturing an optical nano-waveguide is a ridge optical waveguide with a composite ridge structure, which comprises an oxidized refractory metal layer (208) and a thin layer of high refractive index material (203) (e.g. ferroelectric lithium niobate or lithium tantalate slab core region, or alternatively, a tantalum pentoxide or niobium pentoxide slab core region). The refractive index of oxidized refractory metal layer (208) is close to the refractive index of lithium niobate or lithium tantalate. The similar refractive index of the oxidized refractory metal layer (208) to lithium niobate or lithium tantalate enables even distribution of optical power in the slab core region and the ridge region of the waveguide.

In addition, the structure resulting from the novel method of manufacturing the optical nano-waveguide in accordance with an embodiment of the invention achieves low loss and high confinement nano-waveguide. The structure also provides a high overlap of the optical mode with ferroelectric lithium niobate or lithium tantalate in order to take advantage of the optical properties of the ferroelectric lithium niobate or lithium tantalate. These desirable characteristics are easily achieved using the novel method of manufacturing in accordance with an embodiment of the invention, because the refractive index of oxidized tantalum and niobium is very close to lithium niobate and lithium tantalate. Moreover, in one embodiment of the invention, the thickness of the high refractive index slab (203) will be in the range of 100 nm to 1500 nm, depending on the waveguide design. Crystal ion slicing and wafer bonding methods can be used to produce this layer as was explained previously in the inventor's own previous publication (P Rabiei, et. al, Appl. Phys. Lett., vol, 85, pp 4603, (2004)).

Moreover, in one embodiment of the invention, the thickness of the thin optically transparent layer (204) (e.g. silicon dioxide (SiO2) bottom diffusion barrier layer) between the slab core region (203) and the ridge region (208) of the ridge waveguide will vary between 3 to 100 nm. This layer is needed to prevent diffusion of oxygen from the slab core region (203) to the refractory metal layer (205). This layer is needed if the slab core layer is lithium niobate or lithium tantalate. However this layer is optional if the slab core layer is tantalum oxide or niobium oxide, or if there is no slab core layer.

In one embodiment of the invention, the thickness of the low-refractive index lower cladding layer (202) will vary between 1000 nm to 10000 nm. This layer can be thermally grown silicon dioxide (SiO2) layer on a silicon substrate, or can be other low refractive index materials deposited on the base substrate (201). Furthermore, in one embodiment of the invention, the thickness of the refractory metal layer (205) determines the final thickness of the ridge structure. For practical application of the optical waveguides, the thickness of the refractory metal layer (205) can be in the range of 50 nm to 1000 nm. This thickness is determined according to a particular optical waveguide design for achieving a single mode operation and also for implementing a particular confinement for a desired operation wavelength.

Furthermore, in one embodiment of the invention, the thickness and the selected material for the top diffusion barrier layer (206) can vary between 50 nm to 2000 nm depending on the type of the material used. Plasma-enhanced chemical vapor deposition (PECVD) silicon dioxide can be used for this layer because it can be deposited easily and can also be etched easily in reactive ion etching tools. PECVD silicon dioxide can also be selectively removed using a buffered oxide etchant.

In one embodiment of the invention, the refractory metal layer (205) can be tantalum, niobium, or other refractory metals. The oxidized refractory metal layer (208) is tantalum pentoxide or niobium pentoxide in one embodiment of the invention. The thickness of this layer is determined according to the original metallic layer thickness and is approximately 2 times the original metallic layer thickness. The required temperature for oxidation is between 400 C to 700 C, and a particular temperature range is generally determined by requirements associated with a particular metal and a desired thickness. The oxidation time can vary between one hour to several hours according to the particular metal and the desired thickness of the oxidized refractory metal layer (208).

In one embodiment of the invention, a selective etching method is required to selectively remove the non-oxidized refractory metal layer (209) after the removal of the top diffusion barrier layer (206). Chlorine-based plasma etching methods can be used to effectively remove the remaining non-oxidized metal layer while the oxidized region (e.g. 208) will remain unaffected. In general, chlorine-based plasma etching provides a very good selectivity for etching of the non-oxidized refractory metal layer (209) while preserving the oxidized metal (208) layer.

In some embodiments of the invention, it may be advantageous to create "channel" waveguides, instead of "ridge" waveguides. This simpler variant is shown in FIG. 1*a*~FIG. 1*e*, and starts with a base substrate (101), which has a thin layer of lower cladding material with a low refractive index (102). This embodiment of the invention does not include a slab core region or a bottom diffusion barrier layer. The process steps for creation of the channel waveguide is similar to the process for creation of the ridge region of the ridge waveguide explained previously and further elaborated in the detailed description of the invention associated with FIG. 1*a*~FIG. 1*e*.

Figure 2E:
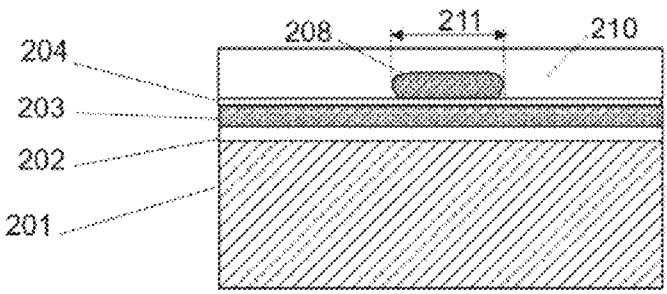

In one embodiment of the invention, the width of the optical waveguide (211) in FIG. 2*e* is controlled by the width of the original via (207) and the time and the temperature used for oxidizing the oxidized refractory metal layer (208). By controlling the oxidation time and the temperature inside the oxidation equipment, it is possible to accurately control the final width of the waveguide (211).

Figure 3A:
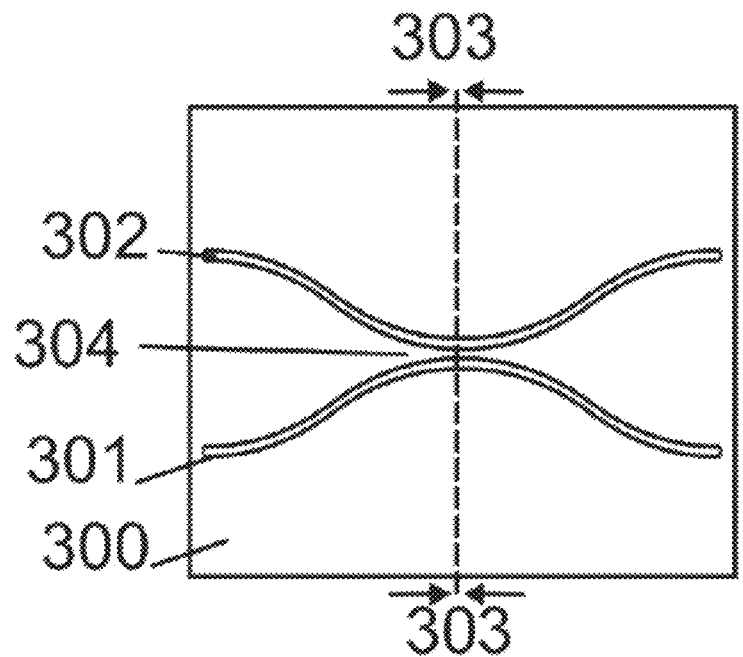
FIG. 3a shows an optical circuit for coupling optical energy between two adjacent waveguides with a small gap between the adjacent waveguides, in accordance with an embodiment of the invention.
Figure 3B:
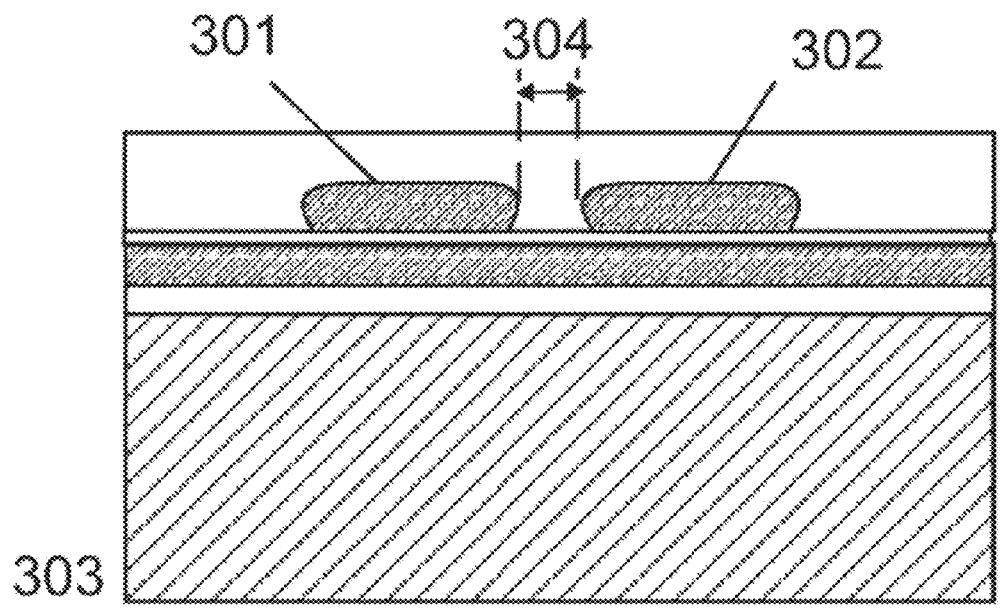
FIG. 3b shows a cross section of an optical circuit for coupling optical energy between two adjacent waveguides with a small gap between the adjacent waveguides, in accordance with an embodiment of the invention.

For many applications in integrated optics, it is required to couple the light between two closely placed waveguides (301) and (302), as shown in FIG. 3. In order to create many optical circuits at a desirable density, it is preferred to configure the gap (304) between these waveguides to a very small feature size (e.g. 50 nm), while keeping a high level of accurate gap width tolerance during manufacturing (e.g. within a tolerance range of +−1 nm).

Conventional lithographic methods generally do not achieve a desirable level of accuracy and dimensions for creating one or more gaps (e.g. 304) between waveguides. One or more embodiments of the present invention enable creation of small feature size gaps with a high level of accurate gap width tolerance by controlling the width of the waveguide during an oxidation process. For example, in one embodiment of the invention, the gap (e.g. 304) between the waveguides can be controlled by controlling the duration of the oxidation process. Using this method in accordance with an embodiment of the invention, a gap as small as 100 nm can be achieved with a tolerance in the order of +−1 nm. Because the duration for oxidation can be controlled easily using this method, one or more embodiments of the present invention enable accurate nano-scale production of gaps (304) between waveguides for integrated optical applications. In an alternate embodiment of the invention, if the refractory metal etching is performed before oxidation, as described above, the refractory metal inflates during oxidation, which enables small gap formations (e.g. 100 nm or smaller), even if the gap on the mask in the lithographic step is large. (e.g. larger than 100 nm). Furthermore, this method can be used to overcome the scattering loss caused by sidewall roughness as well as the difficulties associated with producing very narrow and precision gap for accurate coupling of energy between adjacent waveguides. The waveguide produced by the method disclosed in accordance with an embodiment of the invention can be used as a channel waveguide, or can be used as a ridge layer for a ridge waveguide, wherein the ridge layer has the same material as the slab region or ferroelectric crystal as the slab core layer.

FIGS. 1a~1e show a plurality of process steps for production of highly-confined optical waveguide in accordance with a preferred embodiment of the invention. In the preferred embodiment of the invention, the plurality of process steps disclosed in FIGS. 1a~1e is utilized to produce a channel waveguide. As shown in FIG. 1a, a thin layer of lower cladding material with a low refractive index (102) is placed on top of a base substrate (101). Then, a thin layer of refractory metal (103) is deposited on top of the thin layer of lower cladding material with a low refractive index (102). In this preferred embodiment of the invention, a typical base substrate (101) is a silicon wafer. Furthermore, a typical thin layer of lower cladding material with a low refractive index (102) is silicon dioxide, which is 1-10 microns thick. This layer can be deposited using various deposition methods, or can be grown on the silicon substrate by an oxidation process. Refractory metals (103), which may be used for the thin layer of refractory metal (103), are tantalum and niobium. Typical thickness for the thin layer of refractory metal (103) is 50 nm to 1000 nm.

Then, in the preferred embodiment of the invention for producing the channel waveguide, a top diffusion barrier layer (104) is deposited on top of the thin layer of refractory metal (103), as also shown in FIG. 1a. An example for this layer (i.e. 104) is 500 nm silicon dioxide which is deposited by PECVD or another deposition method. Subsequently, an optical waveguide structure is defined in the photo-resist and etched into the top diffusion barrier layer (104) to define a trench (105). A typical etching method for the top diffusion barrier layer (104) is a dry etching method that uses fluorine-based gas and a plasma etching tool. Alternatively, a liftoff technique can be utilized to form the trench (105).

Figure 1B:
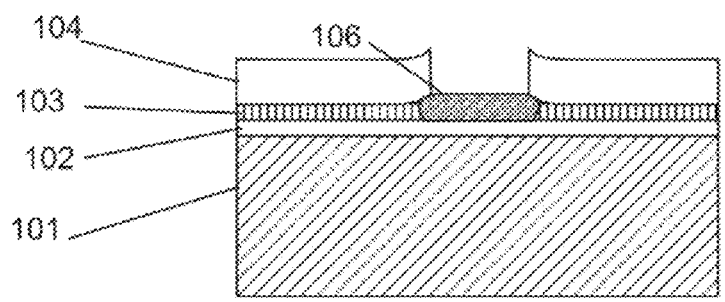

Then, as shown in FIG. 1b, the thin layer of refractory metal (103) is exposed to the oxygen ambient at a high temperature. In this process step, the trench (105), which has the top diffusion barrier layer removed, undergoes an oxidization process by diffusion, thereby oxidizing the exposed portion (i.e. 105) of the refractory metal layer (103) to create an oxidized refractory metal region (106). In one embodiment of the invention, the incomplete channel waveguide structure is placed in a high-temperature oven in an oxygen-rich ambient. The thin layer of refractory metal (103) is then oxidized and converted to the oxidized refractory metal region (106), which is transparent for optical wavelength signals. Typically, the oxidation temperature is 400 C to 700 C, and the duration of the oxidation process is between 0.5 hour to 24 hours. Only the exposed portion (i.e. 105) of the refractory metal layer (103) is oxidized. Therefore, the refractory metal layer (103) under the top diffusion barrier layer (104) remains unchanged.

Figure 1C:
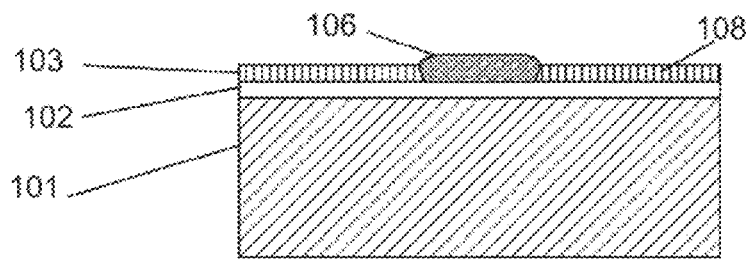
Figure 1D:
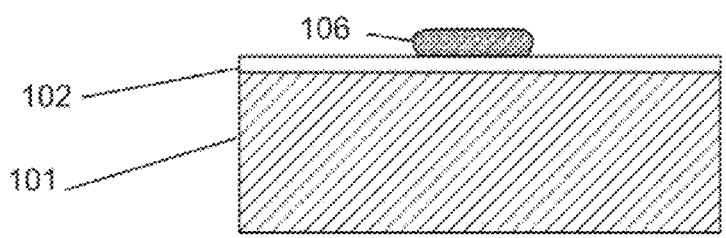
Figure 1E:
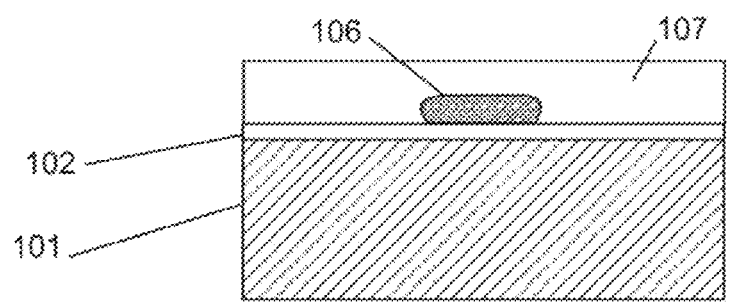

Subsequently, the diffusion barrier layer (104) is removed by some chemical etching agents such as buffered oxide etchant (BOE), as shown in FIG. 1b and FIG. 1c in the preferred embodiment of the invention. Then, the non-oxidized refractory metal region (108) is selectively removed using a dry-etching tool with high-etch selectivity to preserve the oxidized refractory metal region (106), as shown in FIG. 1c and FIG. 1d. In the preferred embodiment of the invention, a chlorine-based chemistry dry etching step is highly effective in removing the refractory metal (103) selectively while preserving the oxidized refractory metal region (106). Then, as an optional step, the incomplete waveguide structure is oxidized again at high temperatures (e.g. between 400 C to 700 C) in order to ensure that any remaining metal particles are oxidized. This step might be not necessary if the metal etching completely removes all of the remaining refractory metals. Lastly, in the final step of the process as shown in FIG. 1e, a top cladding layer (107) made of low refractive index material (e.g. silicon dioxide, polymers, and etc.) is deposited on the waveguide structure, in accordance with the preferred embodiment of the invention.

Typical refractory metals (e.g. 103) that can be used for this process are tantalum and niobium. The oxidized refractory metal (e.g. 106) forms tantalum pentoxide (Ta2O5) or niobium pentoxide (Nb2O5) in the preferred embodiment of the invention. In one example, the refractive index for these materials are approximately 2.0 to 2.3. A high-refractive index contrast optical waveguide can be produced effectively using silicon dioxide (SiO2) or polymer cladding layers with a refractive index of approximately 1.5. Furthermore, because the refractory metal is oxidized by a diffusion process, the roughness at the edge of the waveguide is significantly reduced, thereby enabling a practical manufacturing process for low optical loss waveguides in accordance with one or more embodiments of the invention.

Figure 10A:
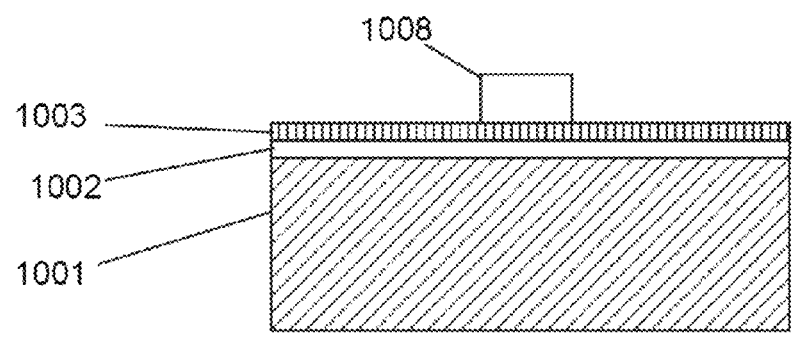
FIGS. 10a~10d show process steps for fabrication of novel channel waveguides with high-refractive index contrast and low loss, wherein the fabrication of the novel channel waveguide utilizes oxidation of refractory metals in accordance with an embodiment of the invention.

In an alternate embodiment of the invention, FIGS. 10a~10d show a plurality of process steps for production of highly-confined optical waveguide in accordance with a preferred embodiment of the invention. In the alternate embodiment of the invention, the plurality of process steps disclosed in FIGS. 10a~10d is utilized to produce a channel waveguide. As shown in FIG. 10a, a thin layer of lower cladding material with a low refractive index (1002) is placed on top of a base substrate (1001). Then, a thin layer of refractory metal (1003) is deposited on top of the thin layer of lower cladding material with a low refractive index (1002). In this preferred embodiment of the invention, a typical base substrate (1001) is a silicon wafer. Furthermore, a typical thin layer of lower cladding material with a low refractive index (1002) is silicon dioxide, which is 1-10 microns thick. This layer can be deposited using various deposition methods, or can be grown on the silicon substrate by an oxidation process. Refractory metals that may be used for the thin layer of refractory metal (1003) are tantalum and niobium. Typical thickness for the thin layer of refractory metal (1003) is 50 nm to 1000 nm.

Figure 10B:
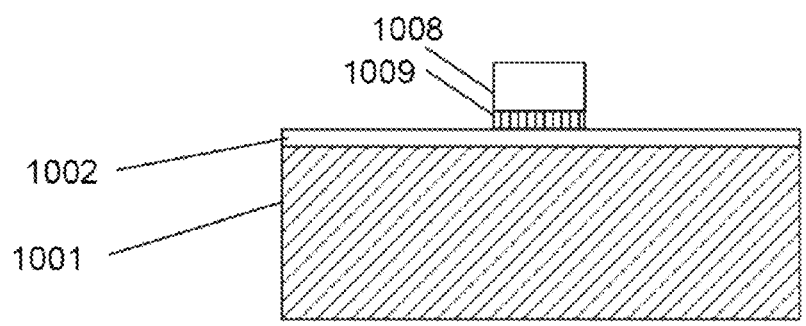

Then, in this alternate embodiment of the invention for producing the channel waveguide, an etch mask layer (1008) is deposited on top of the thin layer of refractory metal (1003), as also shown in FIG. 10*a*. An example for this layer (i.e. 1008) is 500 nm photoresist. Subsequently, an optical waveguide structure is defined in the photo-resist and etched into the thin layer of refractory metal (1003) using a dry-etching tool with high-etch selectivity to preserve the etch mask layer (1008), as shown in FIG. 10*b*. In the alternate embodiment of the invention, a chlorine-based chemistry dry etching step is highly effective in removing the thin layer of refractory metal (1003) selectively while preserving the etch mask layer (1008).

Figure 10C:
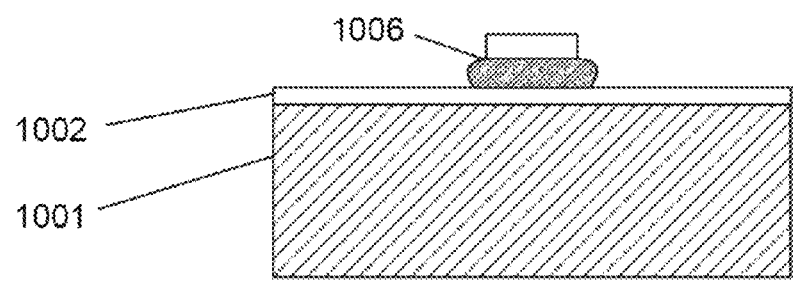

Then, as shown in FIG. 10*b* and FIG. 10*c*, the remaining thin layer of refractory metal (1009) is exposed to the oxygen ambient at a high temperature. In this process step, the remaining thin layer of refractory metal (1009) undergoes an oxidization process to create an oxidized refractory metal region (1006) as shown in FIG. 10*c*. In one embodiment of the invention, the incomplete channel waveguide structure is placed in a high-temperature oven in an oxygen-rich ambient. The remaining thin layer of refractory metal (1009) is then oxidized and converted to the oxidized refractory metal region (1006), which is transparent for optical wavelength signals. Typically, the oxidation temperature is 400 C to 700 C, and the duration of the oxidation process is between 0.5 hour to 24 hours.

Figure 10D:
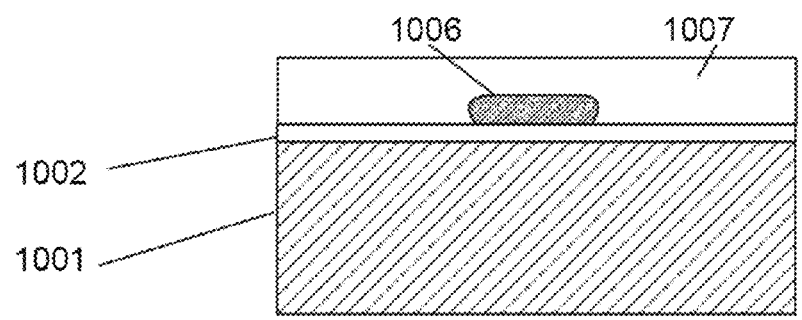

Lastly, in the final step of the process as shown in FIG. 10*d*, a top cladding layer (1007) made of low refractive index material (e.g. silicon dioxide, polymers, and etc.) is deposited on the waveguide structure, in accordance with the alternate embodiment of the invention.

Typical refractory metals (e.g. 1003) that can be used for this process are tantalum and niobium. The oxidized refractory metal (e.g. 1006) forms tantalum pentoxide (Ta2O5) or niobium pentoxide (Nb2O5) in the alternate embodiment of the invention. In one example, the refractive index for these materials is approximately 2.0 to 2.3. A high-refractive index contrast optical waveguide can be produced effectively using silicon dioxide (SiO2) or polymer cladding layers with a refractive index of approximately 1.5. Furthermore, because the refractory metal can be etched highly selectively, and also because the refractory metal inflates during the oxidation process in waveguide formation, roughness is eliminated or only minimal during the manufacturing processes at the edge of the waveguide. This enables a practical manufacturing process for low optical loss waveguides in accordance with one or more embodiments of the invention.

FIG. 1*a*~FIG. 1*e* and their related descriptions in accordance with an embodiment of the invention are used to produce a channel waveguide. For some applications, a ridge waveguide is desirable because it enables easier control of an optical circuitry or a related structure. FIG. 2*a*~FIG. 2*e* show a plurality of process steps for production of highly-confined optical waveguide in accordance with another embodiment of the invention. In this embodiment of the invention, the plurality of process steps disclosed in FIGS. 2*a*~2*e* is utilized to produce a ridge waveguide. As shown in FIG. 2*e*, a completed ridge waveguide structure comprises a slab core region (203) and an oxidized refractory metal layer region (208) (also known as the "ridge" region).

The process steps for producing a channel waveguide as explained previously are similar to the process steps for producing a ridge waveguide in one embodiment of the invention. A first step for production of a ridge waveguide starts with a low refractive index cladding layer (202) deposited or placed on top of a base substrate (201). A thin layer of high refractive index material (203), also called the "slab core region," is deposited or placed on top of the low refractive index cladding layer (202). In one embodiment of the invention, the base substrate (201) is a silicon wafer, and the low refractive index cladding layer (202) is a silicon dioxide layer. In addition, the high refractive index material comprising the slab core region (203) may have a refractive index between 2 to 2.3, which is close to the refractive index of the oxidized refractory metal layer region (208). The thin layer of high refractive index material (203) forms the slab core region of the ridge waveguide. The slab core region can include a lithium niobate crystal or a lithium tantalate crystal.

In one embodiment of the invention, lithium niobate or lithium tantalate layers comprising the slab core region (203) may be produced using an ion slicing technique as described by a publication by the inventor (P Rabiei et. al, Appl. Phys. Lett, 85, 4603, (2004)). Alternatively, the slab core region (203) might be tantalum pentoxide or niobium pentoxide deposited by sputtering or by oxidizing a refractory metal layer (205). In one embodiment of the invention, the thickness of the slab core region (203) varies between 100 nm to 2000 nm, depending on a particular waveguide design. Then, a thin optically-transparent layer (204) typically comprising silicon dioxide (SiO2) is then deposited on top of the slab core region (e.g. 203). In one embodiment of the invention, the thickness of the thin optically-transparent layer (204) is approximately 3-30 nm. This layer will function as a bottom diffusion barrier layer for a subsequent oxidization process.

Then, in the next step, the refractory metal layer (205) is deposited on top of the thin optically-transparent layer (204), and a top diffusion barrier layer (206) is subsequently deposited on top of the refractory metal layer (205). The rest of the production process for the ridge waveguide is similar to the production process for the channel waveguide, which was previously explained in association with FIG. 1*a*~FIG. 1*e*. In particular, the incomplete ridge waveguide structure is placed in an oxygen environment at high temperature for a controlled oxidation process, as shown in FIG. 2*b*. In one embodiment of the invention, tantalum is converted to tantalum oxide, which forms the oxidized refractory metal layer (208) for the ridge waveguide structure. Then, the top diffusion barrier layer (206) is removed using a conventional etching process, as shown in FIG. 2*c*. Subsequently, the remaining non-oxidized refractory metal layer (209) comprising tantalum or another appropriate substance is removed using a chlorine-based plasma etching tool, which is highly selective for removing the remaining non-oxidized refractory metal layer (209) while preserving the oxidized refractory metal layer (208), as shown in FIG. 2*d*. As a final process step in this embodiment of the invention, a top cladding layer (210) comprising silicon dioxide or another appropriate substance is deposited to encapsulate the oxidized refractory metal layer (208).

In an alternate embodiment of the invention, the production process for the ridge waveguide may be similar to the production process for the channel waveguide, which was previously explained in association with FIG. 10*a*~FIG. 10*d*. As shown in FIG. 11*a*~FIG. 11*d*, the thin film refractory metal layer (1105) is deposited on top of the thin optically-transparent layer (1104). Then, a top etch mask layer (1112) is subsequently deposited on top of the thin film refractory metal layer (1105). Subsequently, the unmasked refractory metal layer (1109) comprising tantalum or another appropriate substance is removed using a chlorine-based plasma etching tool, which is highly selective for removing the unmasked refractory metal layer (1109) while preserving the top etch mask layer (1112), as shown in FIG. 11b. Then, as shown in FIG. 11c, the incomplete ridge waveguide structure is placed in an oxygen environment at high temperature for an oxidation process. In one embodiment of the invention, tantalum is converted to tantalum oxide, which forms the oxidized refractory metal layer (1108) for the ridge waveguide structure. As a final process step in this embodiment of the invention, a top cladding layer (1110) comprising silicon dioxide or another appropriate substance is deposited to encapsulate the oxidized refractory metal layer (1108).

In one example of a ridge waveguide in accordance with an embodiment of the invention, a 500 micron-thick silicon substrate with a 1.5 micron-thick thermally-grown silicon dioxide layer (SiO2) as a lower refractive index cladding layer (202) is used. Furthermore, in this example, a 1 micron-thick lithium niobate slab is used as a thin layer of high refractive index material (203), which is placed on top of the lower refractive index cladding layer (202) by wafer bonding and crystal ion slicing process. Then, in this example, a 10 nm-thick silicon dioxide (SiO2) is deposited on top of the high refractive index material (203), wherein this silicon dioxide layer is a thin optically-transparent layer (204) that also acts as a bottom diffusion barrier layer. Then, in this example, a 100 nm-thick tantalum refractory metal layer (205) is deposited on top of the thin optically-transparent layer (204), and a top diffusion barrier layer (206) is also deposited on top of the refractory metal layer (205).

Subsequently, a trench (207) with an exposed portion of refractory metal layer (205) with a varying width (211) between 1 micron to 10 microns is produced by lithography, etching, and other necessary process steps. Then, an oxidation process is performed, for example, at 530 C over 10 hours. In one example, the final thickness of oxidized refractory metal layer (208) (e.g. tantalum) after oxidation is approximately 200 nm. As a final process step, a 1-micron top cladding layer (210) comprising silicon dioxide (SiO2) is deposited to encapsulate the oxidized refractory metal layer (208). Then, each completed ridge waveguide structure, if produced in a batch, can be diced, tested, and packaged as a finalized waveguide unit. In one embodiment of the invention, a ridge waveguide unit produced in accordance with an embodiment of the invention can measure interface and optical losses equal to or lower than 1 dB/cm.

For many integrated optical devices, it is required to couple the light between adjacent waveguides. FIG. 3 shows a directional coupler device (300) in which the light from a first waveguide (301) couples to a second waveguide (302) on a base substrate (303), in accordance with a preferred embodiment of the invention. In the preferred embodiment of the invention, the gap (304) between the waveguides is desired to be substantially less than 1 micron in order to achieve efficient optical coupling. In general, it is challenging to produce gaps in sub-micron scales by using conventional lithographic and etching methods. One or more novel methods for producing optical waveguides, as disclosed in various embodiments of the present invention, has the advantage of generating extremely small gaps between optical waveguides because each gap between the waveguides is controlled by the diffusion of oxygen. A gap as small as 100 nm or less can be repeatedly and consistently produced by controlling the amount of time and the temperature of the oxidization equipment which contains a waveguide structure in the making. In an alternate embodiment of the invention, a small gap is produced by inflation of refractory metal during the oxidation process, which is able to achieve gaps much smaller than the mask size. Therefore, one or more embodiments of the present invention not only disclose one or more methods for producing a low-loss optical waveguide, but also disclose a methods for producing a high-contrast waveguide with a nano-scale narrow gap between waveguides, which enables a higher-density integration of directional couplers and other optical components.

Figure 8A:
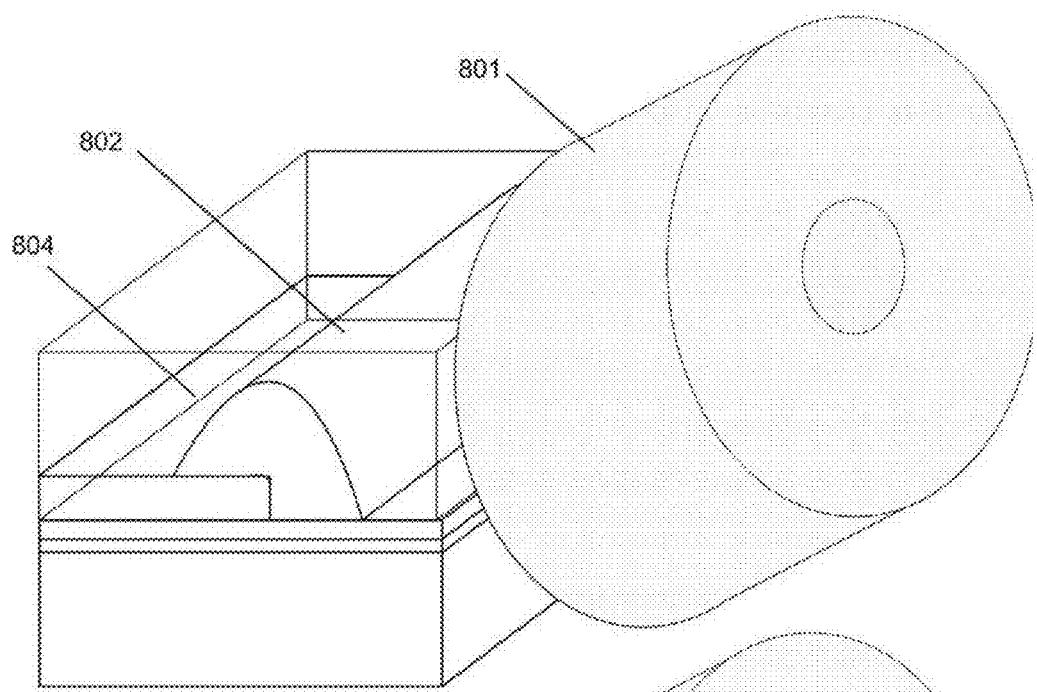
FIGS. 8a and 8b show an arrangement for coupling the optical fiber to the device and a cylinder-shaped micro-lens device or a sphere-shaped micro-lens device in accordance with an embodiment of the invention.
Figure 8B:
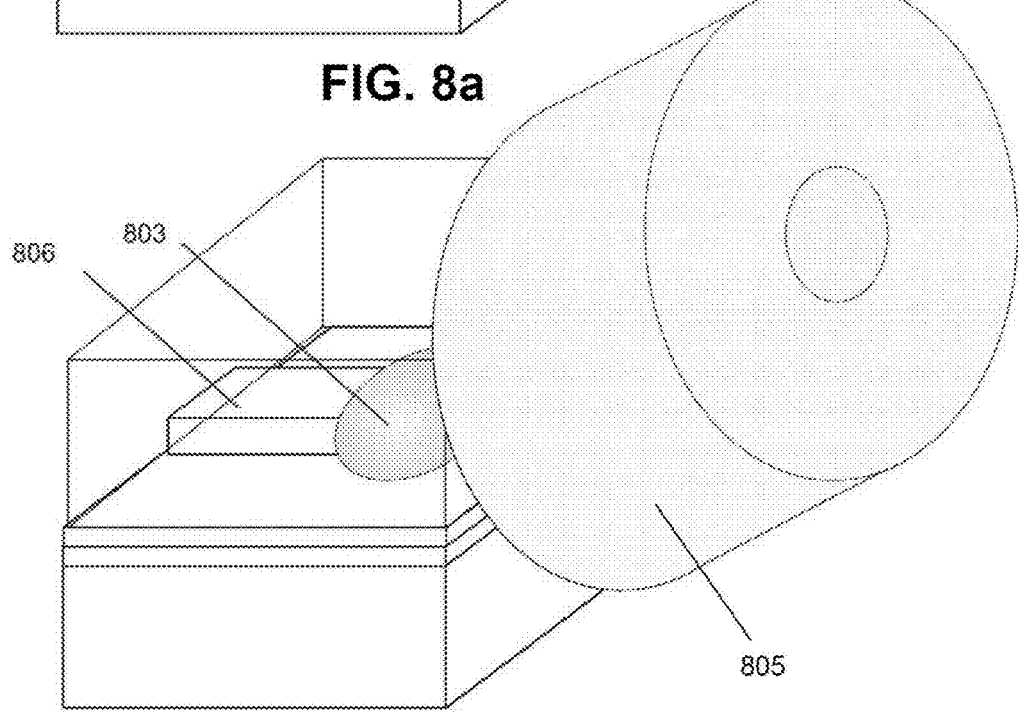

In one embodiment of the invention, a method and a related device for efficient coupling of electromagnetic energy to an optical waveguide at optical wavelengths are also disclosed. For example, FIG. 8a and FIG. 8b show exemplary arrangements of optical coupling in accordance with one or more embodiments of the invention. A cylinder-shaped micro-lens (802) or a sphere-shaped micro-lens (803) is used to couple light from an optical fiber (801 or 805) to a high-refractive index contrast optical waveguide (804 or 806). In this embodiment of the invention, the micro-lens (802 or 803) focuses the energy to the waveguide (804 or 806) operatively connected to the micro-lens (802 or 803).

Furthermore, the optical coupling arrangement as shown in FIG. 8a and FIG. 8b effectively reduces the numerical aperture of the high-refractive index contrast waveguide by approximately 50% due to a reflection of the optical beam from the lower cladding layer at the junction of the high-refractive index contrast waveguide and the micro-lens. This reduction of the numerical aperture requirement enables usage of a lower numerical-aperture micro-lens, while retaining near 100% coupling efficiency.

Figure 9:
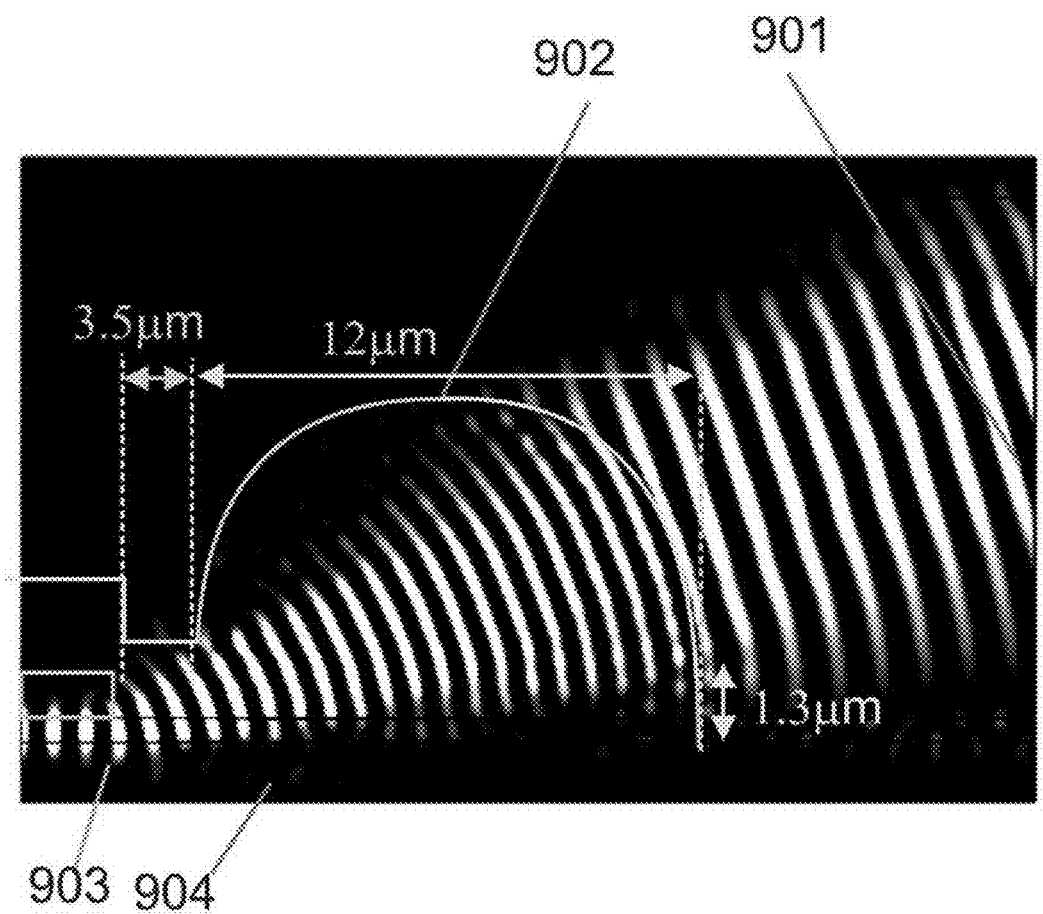
FIG. 9 shows an example of coupling optical energy from an optical fiber to a high-refractive index contrast waveguide in accordance with an embodiment of the invention.

FIG. 9 shows an example of a unique lens design and optical waves for a novel optical-coupling method, in accordance with an embodiment of the invention. The light from an optical fiber (901), which is placed at an angle with respect to an optical waveguide (903), is focused by the surface of a micro-lens (902) fabricated on top of a substrate. The light is focused to a small spot on the interface between the micro-lens (902) and the waveguide (903). Due to reflection from the low-index cladding layer (904) of the waveguide (903), the light couples to the fundamental mode of the high-refractive index contrast waveguide.

As a way to conceptualize a simplified design, we can relate the focal length of the lens to the radius of the lens using the following formula: $f=n_2 R/(n_2-n_1)$, where $n_2$ is the refractive index of the coupling layer and $n_1$ is the refractive index of top cladding layer. In one example, in order to achieve a 10.4-micron beam size that matches an optical fiber mode size, the lens' radius must be around 10 micron. For lithium niobate or similar devices, $n_2$ is approximately 2.2 and $n_1$ is approximately 1.46, if the top cladding layer is silicon dioxide (SiO2). Therefore, in this particular example, a typical lens focal length is approximately 30 microns, if the lens' radius is approximately 10 microns.

In another example, an optical coupling configuration which involves a 6-micron radius micro-lens (902) has calculation results shown in FIG. 9. In this example, a coupling loss of −0.7 dB is obtained for this device with an AR coating layer on the surface of the micro-lens (902) and a standard single mode fiber (SMF28) at 1.55-micron wavelength. In other examples, larger micro-lenses can achieve close to 100% coupling.

The specifics of geometry associated with the novel optical coupling method in accordance with one or more embodiments of the invention enables the numerical aperture of the high-refractive index contrast waveguide to be two times higher than the numerical aperture of the micro-lens without compromising coupling efficiency. Therefore, using at least one embodiment of the invention for optical coupling, a relatively low numerical aperture lens can be used to couple light efficiently.

For example, the numerical aperture required to couple light to a 600-nm high-refractive index contrast waveguide at a wavelength of 1.55 microns as shown in FIG. 9 is approximately 1. This very high numerical aperture cannot be achieved easily using typical lenses with air as the transferring medium in conventional optical methods. In contrast, in one or more embodiments of the present invention, the reflection of the diffracting beam at a lower boundary reduces the required numerical aperture to 0.5, which can be practically manufactured and used in examples including the optical coupling configuration in FIG. 9.

Furthermore, in one embodiment of the invention, a method to fabricate an optical coupler to couple light from an optical fiber to a high-refractive index contrast optical waveguide is disclosed. In one example, the method to fabricate the optical coupler is shown in FIG. 7a~FIG. 7f in accordance with an embodiment of the invention. The process in this example starts with a highly-confined optical nano-waveguide (700) produced by either a conventional method or a novel method of manufacturing as disclosed in one or more embodiments of the present invention.

As shown in FIG. 7a, the high-index contrast waveguide comprises a base substrate (701), a lower cladding layer (702), an upper cladding layer (703), and a core layer (704). The core layer (704) can be in the form of a channel waveguide or a ridge waveguide, as described in other parts of the Specification. In one embodiment of the invention, at the first step of the process, the upper cladding layer (703) is lithographically patterned and etched to expose the core layers, as shown in FIG. 7b. In the next step, a high refractive index coupling layer (705) is deposited on the substrate. Then, a photo-resist layer (706) is deposited on the substrate and lithographically patterned, as shown in FIG. 7d. By using a re-flow method, the photo-resist (706) can be transformed to a spherical surface that forms a micro-lens (706). Then, the micro-lens is transferred to the high-refractive index coupling layer by an etching step to form a micro-lens (708) in the high-refractive index coupling layer (705). Then, in the last step, the micro-lens (708) is optionally covered with a top low refractive index layer (707).

Figure 7E:
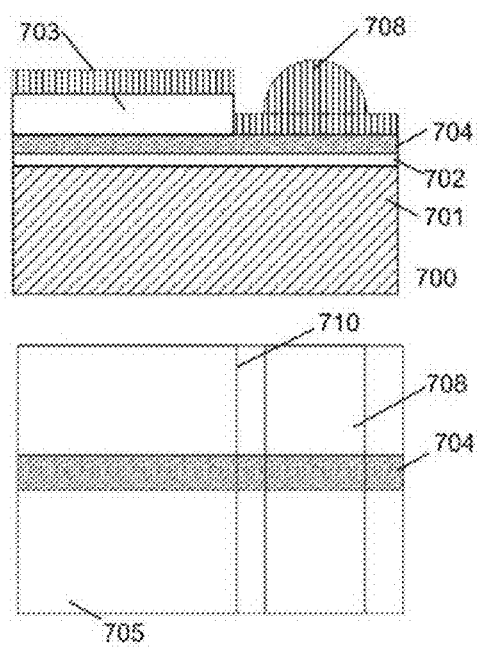
Figure 7F:
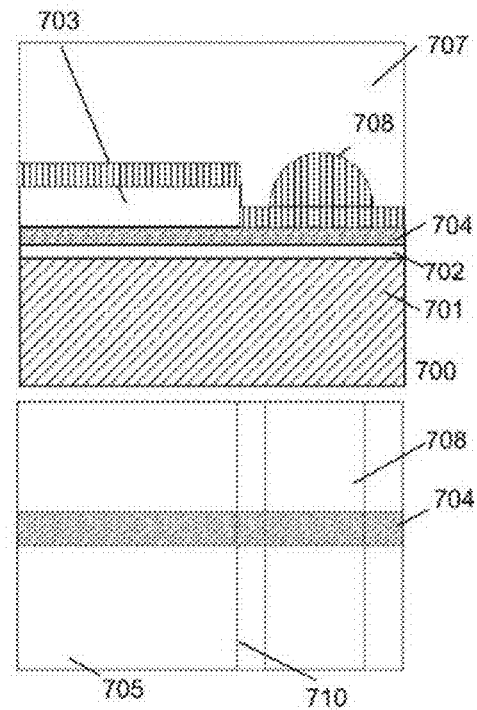

After these process steps shown in FIG. 7a~FIG. 7f, the device is diced with a small gap from the micro-lens and is coupled to an optical fiber (801) polished or placed at an angle as shown in FIG. 8a~FIG. 8b. The optical fiber (801) axis must be placed at an angle with respect to the device (e.g. 802 and 804, or 803 and 806) in order to couple light to a high-index contrast waveguide efficiently. The micro-lens can be a cylinder-shaped micro-lens (802) or a sphere-shaped micro-lens (803), as shown in FIG. 8a and FIG. 8b. Furthermore, the boundary (710) between the waveguide and the micro-lens (708) can be underneath the micro-lens as shown in FIG. 8a and FIG. 8b, or it can be adjacent to micro-lens as shown in FIG. 7f, depending on the design. The cylinder-shaped micro-lens (802) in FIG. 8a can be used to couple light to a high-index contrast slab or a wide channel waveguide (804) in one embodiment of the invention. The sphere-shaped micro-lens (803) can be used to couple light into a narrow channel or a ridge waveguide, as shown in FIG. 8b.

In general, the mechanism for coupling light into a high-index contrast waveguide includes two separate processes. In the first process, the light is focused by the curvature of a micro-lens formed on the device. As an example, FIG. 9 shows at least part of the process for optical coupling. The light from an optical fiber (901) is focused by the surface of a micro-lens (902), so that the light coherently reaches the high-index contrast waveguide layer (903). Once the light reaches the high-index contrast waveguide layer (903), it couples to the high-index contrast waveguide by reflection from a low-index cladding layer (904) into the high-index contrast waveguide layer (903). In this first process of optical coupling, the required numerical aperture for the micro-lens for coupling the light to the high-index contrast waveguide is about 50% smaller compared to a conventional case of optical coupling, which uses polishing the interface of the device and objective lenses. The lower numerical aperture of the micro-lens enabled by the optical coupling method disclosed in one embodiment of the present invention can be used to couple light to a sub-micron high-index contrast waveguide. Using the lower numerical aperture, this novel optical-coupling method may also achieve nearly 100 percent optical coupling efficiency in one embodiment of the invention.

Furthermore, in one embodiment of the invention, the integrated micro-lens not only resolves at least some problems with aligning a plurality of small lenses to the device to achieve efficient coupling, but it also achieves high optical coupling efficiencies between the optical fiber and the high-index contrast waveguide by utilizing lower numerical aperture lenses.

In one embodiment of the invention, the thickness of the high refractive index coupling layer (705) can vary between 3 to 30 microns. This thickness is determined according to the mode size of an optical fiber. The refractive index for this layer is preferred to be identical or slightly higher than the refractive index of the waveguide core layer (704). In one example, if the core layer is lithium niobate, lithium tantalate, tantalum oxide, or niobium oxide, as described in some parts of the Specification, the refractive index of the coupling layer is typically between 2.1-2.4. If the guiding layer is silicon or III-V photonic materials, the refractive index of this layer is typically between 3.2-3.5. Various methods can be used to deposit this layer such as physical vapor deposition, spin coating of high-refractive index materials, reactive sputtering process, plasma enhanced chemical vapor deposition, and other similar methods.

Furthermore, in one embodiment of the invention, the thickness of the photo-resist layer after re-flow process (706) is between 3 to 30 microns, and this thickness is close to the etching thickness of the high-refractive index coupling layer. In addition, in one embodiment of the invention, the etching step transforms the photo-resist pattern to the high-refractive index coupling layer. This process can apply a combination of oxygen with fluorine-based gas chemistry in an inductively-coupled plasma chamber to etch the photo-resist and the high-refractive index coupling layer simultaneously. By adjusting the ratio between the oxygen and the fluorine-based gas, the selectivity of the etch process of the photo-resist to the coupling layer can be finely controlled in order to exercise precise control for shaping the micro-lens. Moreover, in one embodiment of the invention, the top low-refractive index layer (707) is slightly thicker than the thickness of the etched micro-lens, with the thickness ranging between 5 to 40 microns. The refractive index of this layer must be low (e.g. 1.5). Typically, polymer layers or SiO2 layers can be used for this purpose. In an alternative embodiment of the invention, an air gap between a micro-lens (e.g. 706) and an optical fiber can be used without a top low-refractive index layer if it is desirable not to have the top low-refractive index layer in a particular design.

FIG. 7a~FIG. 7f show a production process for fabricating a micro-lens in accordance with an embodiment of the invention. In this embodiment of the invention, this process starts with a high-refractive index contrast waveguide comprising a base substrate (701), a lower cladding layer (702), a core layer (704) which may include slab and ridge layers, and an upper cladding layer (703), as shown in FIG. 7*a*.

In the first step of the process for fabricating the micro-lens in this embodiment of the invention, the upper cladding layer (703) is lithographically-patterned and etched in a plasma etching tool to achieve the structure shown in FIG. 7*b*. Then, a high-refractive index coupling layer (705), which becomes a micro-lens layer, is deposited on top of the core layer (704). Preferably, this layer (705) has a refractive index close to the waveguide core layer (704). In the next step, a photo-resist layer is spin-coated on the sample, and then aligned and patterned lithographically. The photo-resist layer then undergoes a re-flow process to form a micro-lens structure (706) in the photo-resist, as shown in FIG. 7*d*. The micro-lens structure (706) is then transferred to the micro-lens layer (708) by using an etching step. The etching step simultaneously etches the photo-resist and the high-refractive index micro-lens, preferably with 1:1 selectively. Therefore, the pattern of the photo-resist directly transcribes to the micro-lens layer (708) to form the structure shown in FIG. 7*e*. Then, as a final step, a top low-refractive index layer (707) is deposited as a top cladding layer to encapsulate the micro-lens layer (708), as shown in FIG. 7*f*.

Figure 4:
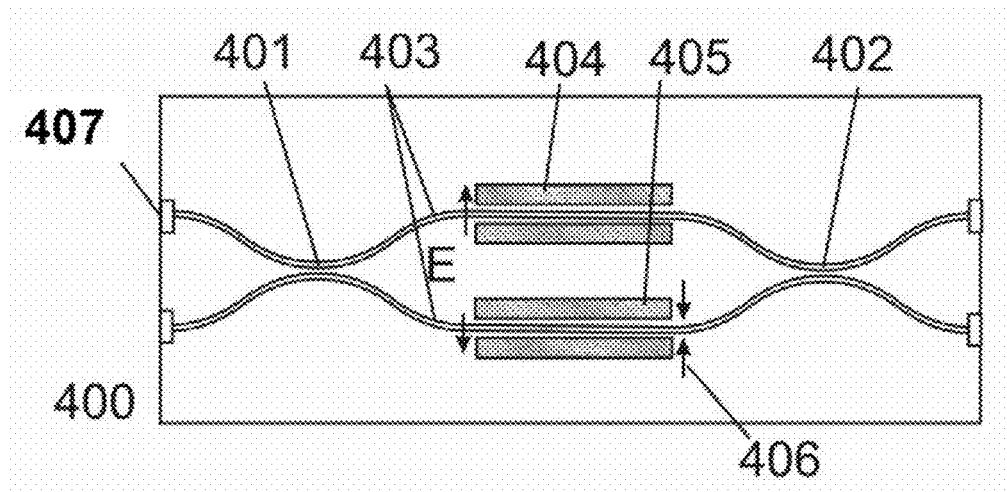
FIG. 4 shows an optical circuit, known as "Mach-Zehnder circuit," for modulation and/or switching of optical signals by applying an electrical signal, in accordance with an embodiment of the invention.

As an example of a low-loss optical waveguide produced by a method of fabricating a waveguide in accordance with an embodiment of the invention, FIG. 4 shows an optical circuit (400) with a plurality of waveguides which forms a modulator device. In general, a modulator device is used to modulate optical intensity or a phase of optical signals by using a radio frequency (RF) electric signal. This modulator comprises two directional couplers (401, 402) that are produced using the method of fabricating optical couplers, as described previously in one or more embodiments of the invention. Furthermore, two low-loss optical waveguides (403) produced by the selective oxidation of refractory metals as described previously in one or more embodiments of the invention are also part of the modulator device in FIG. 4. Furthermore, in the optical modulator example as shown in FIG. 4, two electrodes (404, 405) are used to apply electrical RF signal to the optical modulator to change the refractive index of the lithium niobate slab waveguide (403). Because the confinement of the mode is high, the gap (406) between the electrodes can be as small as 2 microns in one example. Therefore, only a very low modulation voltage is required, compared to a conventional low-confinement optical modulator in lithium niobate. The integrated micro-lens coupler (407), as described in association with FIG. 7*f* in one embodiment of the invention, at least partially contributes to a low-coupling loss in the modulator device.

Figure 5:
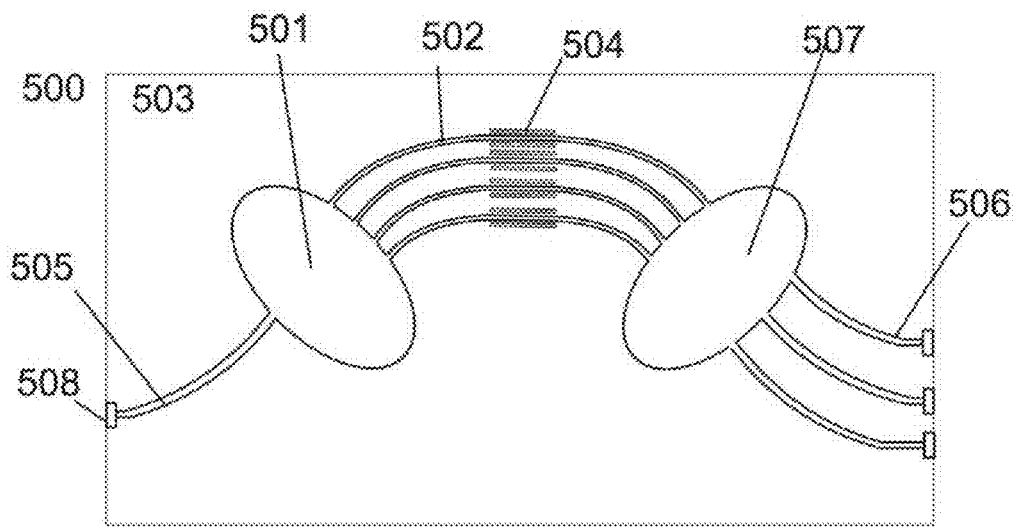
FIG. 5 shows an optical circuit for an array waveguide grating device that can be tuned by applying an electrical signal to array waveguide grating arms, in accordance with an embodiment of the invention.

As another example of an optical circuit that can be produced using a method of producing a high-refractive index contrast waveguide in accordance with an embodiment of the invention, FIG. 5 shows a tunable array waveguide grating device (500) produced using the method of producing the high-refractive index contrast waveguide. An array waveguide grating device comprises an input optical waveguide (505), an input star coupler (501) that couple light between inputs and arms, a plurality of waveguide arms (502) that transport the energy between the input star coupler (501) and an output star coupler (507), and a plurality of output waveguides (506). The input and output waveguides (505, 506), the star couplers (501, 507), and the arms (502) of array waveguide grating can be defined by the novel oxidization method of refractory metal, as described previously in accordance with an embodiment of the invention.

Continuing with FIG. 5, the slab region (503) of all the waveguides may be lithium niobate or lithium tantalate. Electrodes (504) can be deposited on a surface substrate to control the refractive index of the arms (502) of the tunable array waveguide grating device to enable tuning of the tunable array waveguide grating device. This device can behave as a tunable optical filter. The tuning is achieved by applying an electrical signal to at least one of the electrodes (504). The applied electrical signal changes the refractive index of the lithium niobate slab region (503) in order to achieve tuning function. Typically, different electrical voltage levels are needed for each arm to achieve the tuning. Because the electro-optic effect is used, the tuning function can be achieved very rapidly and is influenced by the speed of the applied electrical signal. In this particular example as shown in FIG. 5, micro-lens couplers (508), as described in association with FIG. 7*f*, are used to couple optical energy to the tunable array waveguide device at input and output interfaces.

Figure 6:
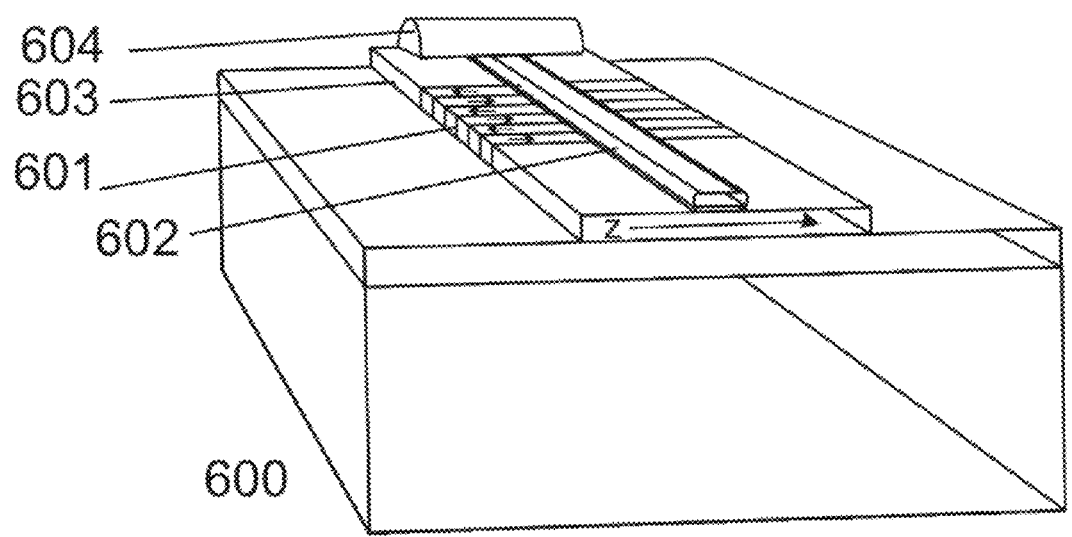
FIG. 6 shows an optical circuit with periodically domain-inverted lithium niobate or lithium tantalite waveguide that can be used for transferring optical energy among different optical wavelength bands, in accordance with an embodiment of the invention.

Another example of a device that can be produced based on the a novel method of fabricating high-confinement optical waveguides in accordance with an embodiment of the invention is a periodically domain-inverted lithium niobate crystal waveguide. FIG. 6 shows a structure for a periodically domain-inverted lithium niobate waveguide (600) that can be fabricated in accordance with an embodiment of the invention. A periodically domain-inverted lithium niobate waveguide can be used for conversion of optical wavelength or for amplification of optical signals. Because of the confinement of the waveguide in this particular example is substantially large, the efficiency for nonlinear optical processes is very high (i.e. because for a given power, the intensity of optical signal is large).

One or more embodiments of the present invention, which disclose a novel method of producing an optical waveguide, can be applied to the manufacturing of a periodically domain-inverted lithium niobate crystal waveguide. For example, a ridge structure (602) is fabricated on lithium niobate or lithium tantalate slab layer (603), as described previously for the novel method of producing the optical waveguide. For production of the periodically domain-inverted lithium niobate crystal waveguide, an extra step may be needed to etch the slab layer to form periodic-poled domains (601). The periodically-poled domains (601) in the structure are formed by applying a spatially-periodic potential to the −z and +z face of the crystal, which is conducted after the etching step. The periodically domain-inverted domains in the periodically domain-inverted lithium niobate crystal waveguide convert optical energy between different wavelengths. This device can be used to convert or mix optical energy in different optical wavelengths, or to amplify a weak optical signal by mixing it with another strong optical signal in order to amplify the weak signal. In this particular example as shown in FIG. 6, micro-lens couplers (604), as described in association with FIG. 7*f* in one embodiment of the invention, are integrated with the periodically domain-inverted lithium niobate crystal waveguide in order to achieve efficient optical coupling.

Figure 12:
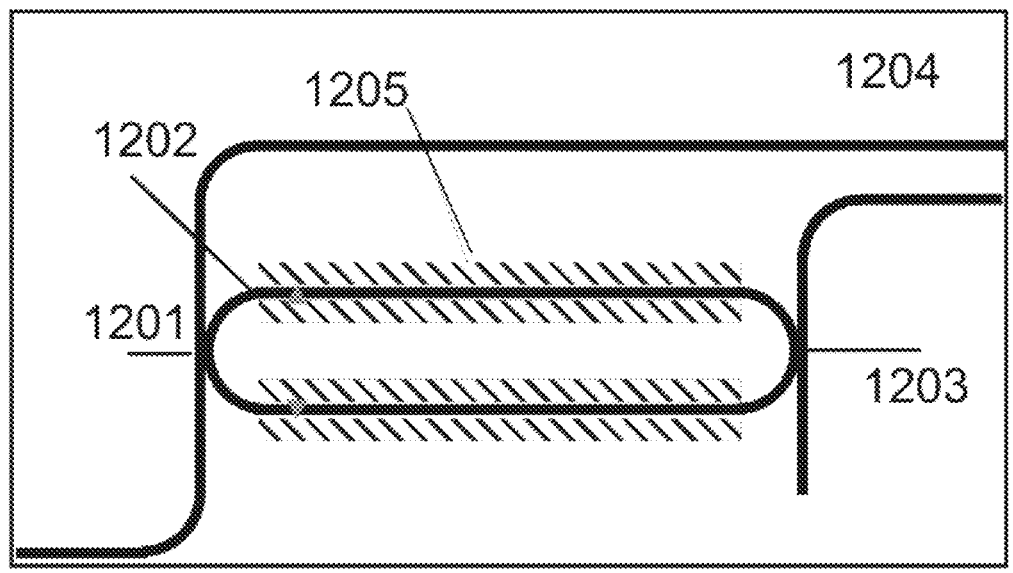
FIG. 12 shows a micro-ring optical circuit for modulation and/or switching of optical signals by applying an electrical signal, in accordance with an embodiment of the invention.

As another example of an optical circuit that can be produced using a method of producing a high-refractive index contrast waveguide in accordance with an embodiment of the invention, FIG. 12 shows a micro-ring modulator device produced in accordance with an embodiment of the invention. A micro-ring modulator device, as shown in FIG. 12, comprises an input coupler (1201) that couples light between an input waveguide and a micro-ring resonator (1202), and an optional output waveguide (1203). The output waveguide (1203) and the rest of the micro-ring structure, as shown in FIG. 12, can be defined by a novel oxidization method of refractory metal, as described previously in accordance with an embodiment of the invention.

Continuing with FIG. 12, the slab region (1204) for all of the waveguides in the micro-ring modulator device can be made from lithium niobate or lithium tantalate. Furthermore, electrodes (1205) can be deposited on a surface substrate to control the refractive index of the micro-ring resonator (1202) to enable modulation. This device can behave as a tunable optical filter or an optical modulator. The tuning is achieved by applying an electrical signal to at least one of the electrodes (1205). The applied electrical signal changes the refractive index of the slab region (1204) in order to achieve tuning or modulation function.

Figure 13:
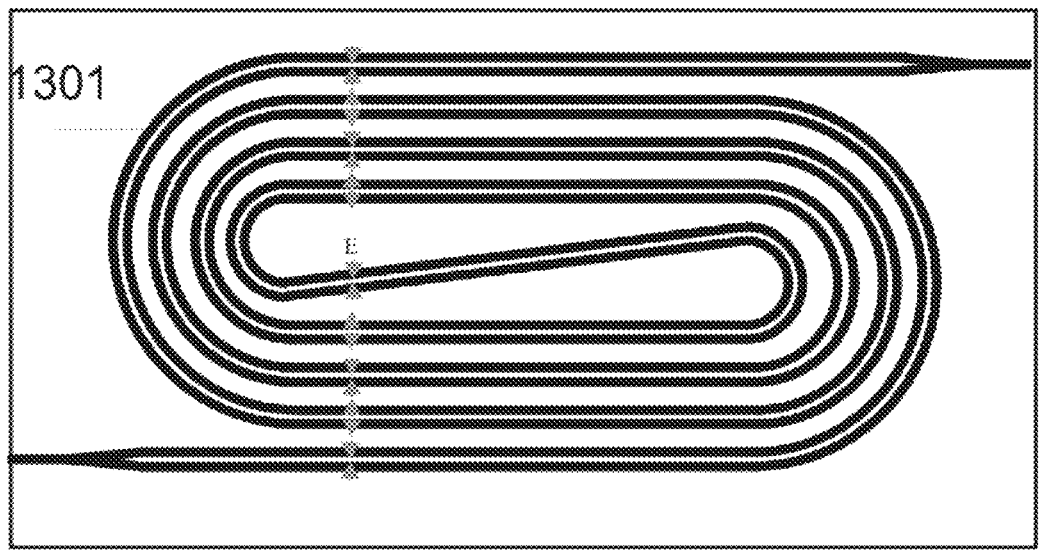
FIG. 13 shows an optical circuit, known as the "Mach-Zehnder circuit with folded arms," for modulation and/or switching of optical signals by applying an electrical signal, in accordance with an embodiment of the invention.

As another example of an optical circuit that can be produced using a method of producing a high-refractive index contrast waveguide in accordance with an embodiment of the invention, FIG. 13 shows a Mach-Zehnder modulator device produced in accordance with an embodiment of the invention. The Mach-Zehnder modulator devices, as shown in FIG. 4, are typically very long (i.e. more than 1 cm long) because of the weak electro-optic effect. By using the high index contrast waveguide technology as described in various embodiments of this invention, it is possible to "fold" the Mach-Zehnder modulator device as shown in FIG. 13. The arms (1301) of the Mach-Zehnder modulator device are shown in FIG. 13. Preferably, the electrodes are placed with alternate voltage in order to achieve modulation. For simplification of the figure, the electrodes are not drawn in FIG. 13. It is possible to achieve traveling-wave RF electrodes in this structure, but the polarity of the wave must be alternated, as shown in FIG. 13, to function as a modulator.

Figure 14:
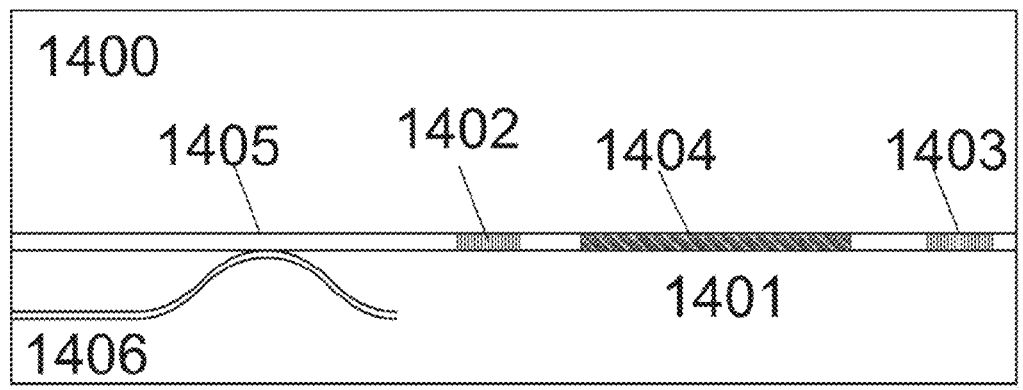
FIG. 14 shows an optical circuit for generation of laser light using rare earth doped sections (e.g. erbium), in accordance with an embodiment of the invention.

As another example of an optical circuit that can be produced using a method of producing a high-refractive index contrast waveguide in accordance with an embodiment of the invention, FIG. 14 shows a solid state laser device produced in accordance with an embodiment of the invention. The solid state laser device, as shown in FIG. 14, comprises a cavity (1401) formed between a first mirror (1402) and a second mirror (1403). The gain section (1404) of the solid state laser device comprises a rare earth-doped section. Rare earth elements, such as erbium or neodymium, can be doped into lithium niobate crystal to achieve spontaneous emission gain for amplification of light. The high index contrast waveguide fabrication methods, as previously described in one or more embodiments of the invention, can be utilized to make the solid state laser device. Using high-refractive index contrast waveguides, it is possible to achieve higher gain because the intensity of light in the core of the waveguide is higher. The rare earth elements can be doped into a slab region (1400), a ridge region, or both regions in accordance with a particular laser device design. Furthermore, grating sections (1402, 1403) can be produced in the ridge section of the high-refractive index contrast waveguide during the etching step of refractory metal layer or in the slab region using other methods. A coupler (1405) for a pump laser light (1406) is needed to pump the rare earth-doped elements, and can be designed and fabricated in accordance with one or more embodiments of the invention.

Figure 15:
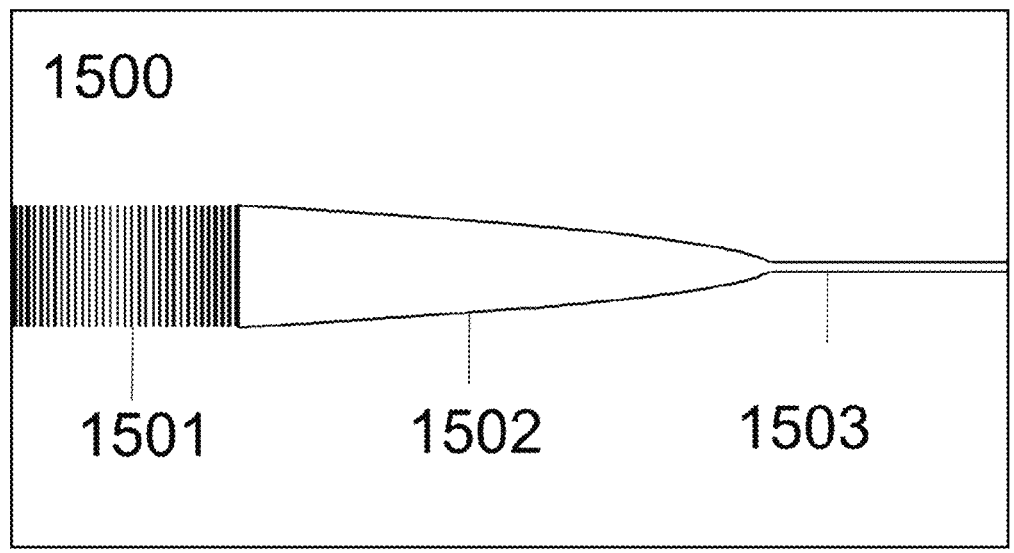
FIG. 15 shows a grating coupler device produced in accordance with an embodiment of the invention

In addition, as another example of an optical circuit that can be produced using a method of producing a high-refractive index contrast waveguide in accordance with an embodiment of the invention, FIG. 15 shows a grating coupler device that is produced in accordance with an embodiment of the invention. The grating coupler device (1500), as shown in FIG. 15, comprises a grating (1501) followed by a parabolic taper (1502). The grating section (1501) couples the light from an optical fiber to the high index contrast waveguide with a width (1503) matched to an optical fiber. The grating consists of a periodic array of ridge or channel waveguide with varying periodicity and coupling strength to couple the guided mode of high index contrast waveguide to a Gaussian optical mode matched to the mode of an optical fiber. The parabolic tapers section (1502) then converts this mode to a smaller optical waveguide (1503) mode that is used for making optical circuits described in previous examples. The high index contrast waveguide fabrication methods, as previously described in one or more embodiments of the invention, can be utilized to make the grating coupler device. Using high-refractive index contrast waveguides, it is possible to make short grating sections that are matched to an optical fiber mode size. The grating section can be produced in the ridge section of a ridge high-refractive index contrast waveguide during the etching step of refractory metal layer or it can be etched completely into the slab region of a high index contrast waveguide or it can be made in the channel section of a hig index contrast waveguides described in one or more embodiments of the invention.

Furthermore, all of the devices and various photonic components, as shown in FIGS. 12~15, can be incorporated in a monolithically-integrated circuit. In addition, because substrates utilized in producing these devices can be based on silicon, it is possible to integrate some or all of the photonic components with electronic circuitry, thereby creating an integrated electronic-photonic platform, wherein electronic signals are utilized for information processing, and photonic signals are utilized for information transport. Such an integrated electronic-photonic platform may be highly desirable for future computing, communication, and sensing applications.

Various embodiments of the present invention introduce one or more novel methods to produce optical waveguides. In one embodiment of the invention, an optical waveguide is produced by oxidizing a refractory metal. Due to diffusion process involved in this method, the sidewall of optical waveguide becomes desirably smooth, thereby resulting in a low-loss optical waveguide. Furthermore, due to the diffusion process, the gap between adjacent coupled waveguides can be controlled very precisely and can be nano-scale narrow (e.g. as narrow as 10 nm), which is desirable for various modern optical circuits and applied devices.

Furthermore, in one embodiment of the invention, a method to fabricate an optical coupler to couple light from an optical fiber to a high-refractive index contrast optical waveguide is disclosed. The lower numerical aperture of the micro-lens enabled by the optical coupling method disclosed in an embodiment of the invention can be used to couple light to a sub-micron high-index contrast waveguide. Using the lower numerical aperture, this novel optical-coupling method may also achieve nearly 100 percent optical coupling efficiency in one embodiment of the invention.

Furthermore, in one embodiment of the invention, the integrated micro-lens not only resolves at least some problems with aligning a plurality of small lenses to the device to achieve efficient coupling, but it also achieves high optical coupling efficiencies between the optical fiber and the high-index contrast waveguide by utilizing lower numerical aperture lenses.

In addition, the optical coupling method described in one or more embodiments of the present invention overcomes difficult challenges associated with high-refractive index contrast waveguides. The resulting optical coupler in accordance with an embodiment of the invention is easy to manufacture, polarization insensitive, wavelength insensitive, and very compact. The optical coupling method in accordance with an embodiment of the invention, and the waveguide production method also described in accordance with another embodiment of the invention resolve some significant challenges for high-refractive index contrast waveguides which use lithium niobate or lithium tantalate. One or more embodiments of the invention achieve low-loss waveguides, precise control for coupled waveguides, and efficient optical coupling to high-refractive index contrast waveguides. These advantages in one or more embodiments of the invention enable small-footprint, nano-scale, and highly-efficient optical circuits to be manufactured more easily and cost effectively.

Many optical circuits such as array waveguide grating, periodically poled nonlinear optical circuits, micro-resonators, optical modulators, solid state lasers, and numerous integrated platforms combining these optical circuits can be made based on one or more embodiments of the invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for producing a high-refractive index contrast and low loss optical waveguide, the method comprising the steps of:
    depositing or growing a first low refractive index material layer as a cladding layer on top of a silicon base substrate;
    depositing or transferring a first high refractive index material layer on top of the first low refractive index material layer to form a slab core region;
    depositing a second high refractive index material layer on top of the slab core region;
    forming an etch mask layer on the second high refractive index material layer;
    selectively etching the second high refractive index material layer by utilizing a dry-etching tool with high selectivity to the etch mask layer; and
    depositing a second low refractive index material layer as a top cladding layer to encapsulate the second high refractive index material layer on top of lower cladding layers.

2. The method for producing the high-refractive index contrast and low loss optical waveguide of claim 1, wherein the first low refractive index material layer and the second low refractive index material layer are each made of silicon dioxide, and wherein the first high refractive index material layer is made of lithium niobate and lithium tantalate, with a refractive index approximately between 2 and 2.3 to match the second high refractive index material layer's refractive index.

3. The method for producing the high-refractive index contrast and low loss optical waveguide of claim 2, wherein the step of depositing the first high refractive index material layer utilizes an ion slicing technique, if the lithium niobate or the lithium tantalite forms the first high refractive index material layer.

4. The method for producing the high-refractive index contrast and low loss optical waveguide of claim 2, wherein the step of depositing the second high refractive index material layer utilizes sputtering or evaporation to form the second high refractive index material layer.

5. The method for producing the high-refractive index contrast and low loss optical waveguide of claim 1, wherein the slab core region has a thickness approximately between 100 nm and 2000 nm.

6. The method for producing the high-refractive index contrast and low loss optical waveguide of claim 1, wherein the second high refractive index material layer is made of tantalum oxide, niobium oxide, titanium oxide, lanthanum oxide, another metal oxide, or a high index composite made thereof, with an approximate thickness between 50 nm and 1000 nm and approximate refractive index around 2.2 or higher.

7. The method for producing the high-refractive index contrast and low loss optical waveguide of claim 1, wherein the second low refractive index material layer as the top cladding layer is based on silicon dioxide or polymers with a refractive index of approximately 1.5.

* * * * *